United States Patent
Huang et al.

(10) Patent No.: US 11,611,347 B2
(45) Date of Patent: Mar. 21, 2023

(54) INTEGRATOR AND ANALOG-TO-DIGITAL CONVERTER

(71) Applicant: SILERGY SEMICONDUCTOR TECHNOLOGY (HANGZHOU) LTD, Zhejiang (CN)

(72) Inventors: Ying Huang, Zhejiang (CN); Di Gao, Zhejiang (CN); Kun Li, Zhejiang (CN); Jinyu Qin, Zhejiang (CN)

(73) Assignee: SILERGY SEMICONDUCTOR TECHNOLOGY (HANGZHOU) LTD, Hangzhou (CN)

( * ) Notice: Subject to any disclaimer, the term of this patent is extended or adjusted under 35 U.S.C. 154(b) by 0 days.

(21) Appl. No.: 17/375,803

(22) Filed: Jul. 14, 2021

(65) Prior Publication Data

US 2022/0021395 A1  Jan. 20, 2022

(30) Foreign Application Priority Data

Jul. 15, 2020 (CN) .......................... 202010682961.0

(51) Int. Cl.
 *H03M 1/06* (2006.01)
(52) U.S. Cl.
 CPC ................................. *H03M 1/0607* (2013.01)
(58) Field of Classification Search
 CPC .................................................. H03M 1/0607
 USPC ........ 341/155, 144, 143, 163, 122, 120, 118
 See application file for complete search history.

(56) References Cited

U.S. PATENT DOCUMENTS

| | | | | |
|---|---|---|---|---|
| 5,136,255 A | * | 8/1992 | Fattaruso | G06G 7/1865 330/296 |
| 5,739,720 A | * | 4/1998 | Lee | H03F 3/45968 330/9 |
| 6,617,887 B2 | * | 9/2003 | Nix | H03K 5/249 327/337 |

OTHER PUBLICATIONS

Extended European Search Report regarding Application No. 21185102.7 dated Dec. 1, 2021.
Zhang, Zhou et al., "A Low-power 14-bit Two-stage Hybrid ADC for Infrared Focal Plane Array Detector," IEEE Information Technology, Networking, Electronic and Automation Control Conference, May 2016, pp. 386-390.
Wu, Dong et al. "A Low Power Double-Sampling Extended Counting ADC with Class-AB OTA for Sensor Arrays," IEEE Transactions on Circuits and Systems I: Regular Papers, vol. 62, No. 1; Jan. 2015, pp. 29-38.

* cited by examiner

*Primary Examiner* — Peguy Jean Pierre
(74) *Attorney, Agent, or Firm* — Harness, Dickey & Pierce, P.L.C.

(57) ABSTRACT

An integrator and an analog-to-digital converter are provided. The analog-to-digital converter includes the integrator, a comparison circuit and a control logic circuit. The integrator includes an operational amplifier, offset capacitors, input capacitors, integral capacitors and controllable switches. The input capacitors and the integral capacitors are connected to the operational amplifier via controllable switches, so that the integrator operates in various operation modes. Operation states of the offset capacitors in a first phase and a second phase of an operation cycle are controlled by switching on or off the controllable switches. Therefore, an offset voltage of the integrator is eliminated, and conversion efficiency and conversion accuracy of the analog-to-digital converter is improved.

28 Claims, 12 Drawing Sheets

INTEGRATOR AND ANALOG-TO-DIGITAL CONVERTER

The present application claims priority to Chinese Patent Application No. 202010682961.0, titled "INTEGRATOR AND ANALOG-TO-DIGITAL CONVERTER", filed on Jul. 15, 2020 with the China National Intellectual Property Administration, which is incorporated herein by reference in its entirety.

FIELD

The present disclosure relates to the technical field of power electronics, and in particular to an integrator and an analog-to-digital converter.

BACKGROUND

With the rapid development of science and technology, digital signal processing technology is widely used in various fields of science and daily life. A signal processed by a digital signal processing system is a digital signal. However, signals in nature such as a temperature signal, a pressure signal, a speed signal and a sound signal that are usually used in industrial detection and control as well as in daily life are all analog signals which are continuously changing during a period of time. These analog signals are converted into digital signals so as to be processed by a digital system. Therefore, an analog-to-digital converter (ADC) is a key component connecting an analog system and a digital system.

FIG. 1 is a circuit diagram of a $\Sigma$-$\Delta$ (Sigma-delta) analog-to-digital converter in the conventional technology. The $\Sigma$-$\Delta$ analog-to-digital converter adopts over-sampling and noise shaping technologies to achieve high analog-to-digital conversion accuracy at the expense of conversion speed. However, conversion efficiency is relatively low in a case of high conversion accuracy.

FIG. 2 is a circuit diagram of a successive approximation register (SAR) analog-to-digital converter in the conventional technology. The successive approximation register analog-to-digital converter achieves high conversion efficiency by dividing a reference voltage signal. With the increase of conversion accuracy, a resistance voltage divider network becomes very large, and the number of required gate switches increases exponentially. Moreover, the reference voltage is susceptible to white noise and bounce noise. Therefore, the successive approximation register analog-to-digital converter is difficult to achieve high-accuracy conversion.

FIG. 3 is a schematic structural diagram of an analog-to-digital converter combining an SAR analog-to-digital converter and a $\Sigma$-$\Delta$ analog-to-digital converter in the conventional technology. The $\Sigma$-$\Delta$ analog-to-digital converter performs high-order conversion and the SAR analog-to-digital converter performs low-order conversion. In addition, an original voltage divider network is replaced by a register, so that for each additional bit of effective digit, only one comparison cycle is increased instead of increasing hardware as in the successive approximation register analog-to-digital converter. Therefore, the analog-to-digital converter combining an SAR analog-to-digital converter and a $\Sigma$-$\Delta$ analog-to-digital converter achieves high accuracy easily. However, the analog-to-digital converter combining an SAR analog-to-digital converter and a $\Sigma$-$\Delta$ analog-to-digital converter cannot completely eliminate an offset voltage of an operational amplifier. The offset voltage of the operational amplifier is directly reflected in a differential output voltage of the integrator. In addition, the offset voltage of the operational amplifier varies with a voltage of a power supply and a temperature. Therefore, a temperature feature and a power supply suppression feature of the ADC deteriorates due to the offset voltage of the operational amplifier even if the system calibrates the offset error of the ADC at the room temperature and a typical operation voltage.

SUMMARY

In view of this, an integrator and an analog-to-digital converter are provided according to the present disclosure, to eliminate an offset voltage of the integrator, so as to improve conversion efficiency and conversion accuracy of the analog-to-digital converter.

An integrator is provided according to the first aspect of the embodiments of the present disclosure. The integrator includes an operational amplifier, a first offset capacitor, a second offset capacitor, multiple controllable switches, multiple input capacitors and multiple integral capacitors. The operational amplifier includes a first input terminal, a second input terminal, a first output terminal and a second output terminal. The first offset capacitor is coupled to the first input terminal, and the second offset capacitor is coupled to the second input terminal. The input capacitors and the integral capacitors are connected to the operational amplifier via the controllable switches, to control operation modes of the integrator. The controllable switches are configured to control operation states of the first offset capacitor and the second offset capacitor in a first phase and a second phase of an operation cycle to eliminate an offset voltage of the operational amplifier.

In an embodiment, the first offset capacitor and the second offset capacitor are configured to store the offset voltage in the first phase. The offset voltage of the operational amplifier is eliminated by counteracting the stored offset voltage with a voltage across the first offset capacitor and a voltage across the second offset capacitor in the second phase.

In an embodiment, the operation mode of the integrator include a return-to-zero mode, a first integral mode and a second integral mode.

In an embodiment, the integrator is reset in a first phase of the return-to-zero mode.

In an embodiment, the integrator is configured to, in a second first phase of the return-to-zero mode, sample an input voltage signal and output the sampled input voltage signal.

In an embodiment, the integrator is configured to, in the first integral mode: sample a reference voltage signal and output an integral signal in a last operation cycle; and sample an input voltage signal and a reference voltage signal and output an integral signal in an operation cycle other than the last operation cycle.

In an embodiment, in the first integral mode, an integral signal outputted by the integrator in a last operation cycle is equal to a sum of an integral signal outputted by the integrator in an operation cycle immediately before the last operation cycle and a first signal; and an integral signal outputted by the integrator in an operation cycle other than the last operation cycle is equal to a sum of an integral signal outputted by the integrator in a previous operation cycle, the first signal and an input voltage signal. The first signal is a product of a reference voltage signal and a first coefficient.

In an embodiment, the integrator is configured to, in the second integral mode, amplify an output voltage of the integrator in a previous operation cycle.

In an embodiment, the integrator is configured to, in a first phase of the second integral mode, sample a reference voltage signal and output an integral signal.

In an embodiment, in a second phase of the second integral mode, an integral signal outputted by the integrator in a current operation cycle is equal to a multiple of a sum of an integral signal outputted by the integrator in an operation cycle immediately before the current operation cycle and a first signal. The first signal is a product of a reference voltage signal and a first coefficient.

In an embodiment, in a case that the integrator is configured to receive a positive reference voltage signal in the first phase and receive a negative reference voltage signal in the second phase, the first coefficient is equal to 1. In a case that the integrator is configured to receive a negative reference voltage signal in the first phase and receive a positive reference voltage signal in the second phase, the first coefficient is equal to −1. In a case that the integrator is configured to receive a zero reference signal in the first phase and the second phase, the first coefficient is equal to 0.

In an embodiment, the input capacitors include a first input capacitor and a second input capacitor. The integral capacitors include a first integral capacitor, a second integral capacitor, a third integral capacitor and a fourth integral capacitor. The first input capacitor, the first integral capacitor and the second integral capacitor each are configured to be coupled to at least one of the first input terminal and the first output terminal of the operational amplifier. The second input capacitor, the third integral capacitor and the fourth integral capacitor each are configured to be coupled to at least one of the second input terminal and the second output terminal of the operational amplifier. In the second integral mode, the second integral capacitor is configured to charge the first integral capacitor in a current operation cycle, the first input capacitor is configured to charge the first integral capacitor in an operation cycle immediately after the current operation cycle, the fourth integral capacitor is configured to charge the third integral capacitor in the current operation cycle and the second input capacitor is configured to charge the third integral capacitor in the operation cycle immediately after the current operation cycle, to amplify an output voltage of the integrator in the current operation cycle.

In an embodiment, in the second integral mode, in the first phase, each of the first integral capacitor, the second integral capacitor, the third integral capacitor and the fourth integral capacitor is configured to maintain charges that are stored in an operation cycle immediately before the current operation cycle. The first input capacitor and the second input capacitor each are configured to discharge. In the second phase, the first integral capacitor is connected between the first input terminal and the first output terminal of the operational amplifier, the third integral capacitor is connected between the second input terminal and the second output terminal of the operational amplifier, the second integral capacitor is configured to charge the first integral capacitor, and the fourth integral capacitor is configured to charge the third integral capacitor, to amplify an output voltage of the operational amplifier. The first input capacitor and the second input capacitor are configured to sample the output voltage of the integrator.

In an embodiment, in the second integral mode, in the first phase, each of the first input capacitor, the second input capacitor, the first integral capacitor and the third integral capacitor is configured to maintain charges that are stored in the operation cycle immediately before the current operation cycle. The second integral capacitor and the fourth integral capacitor each are configured to discharge. In the second phase, the first integral capacitor is connected between the first input terminal and the first output terminal of the operational amplifier, the third integral capacitor is connected between the second input terminal and the second output terminal of the operational amplifier, the first input capacitor is configured to charge the first integral capacitor and the second input capacitor is configured to charge the third integral capacitor to amplify an output voltage of the operational amplifier. The second integral capacitor and the fourth integral capacitor are configured to sample the output voltage of the integrator.

In an embodiment, the input capacitors include a first input capacitor, a second input capacitor, a third input capacitor and a fourth input capacitor. The first input capacitor and the third input capacitor each are configured to be coupled to the first input terminal of the operational amplifier. The second input capacitor and the fourth input capacitor each are configured to be coupled to the second input terminal of the operational amplifier. The first input capacitor and the second input capacitor are configured to receive an input voltage signal or a common mode voltage signal. The third input capacitor and the fourth input capacitor are configured to receive a reference voltage signal or a common mode voltage signal.

An analog-to-digital converter is provided according to a second aspect of the embodiments of the present disclosure. The analog-to-digital converter includes an integrator, a comparison circuit and controllable switches. The integrator includes an operational amplifier, multiple controllable switches and multiple capacitors. The operational amplifier includes a first input terminal, a second input terminal, a first output terminal and a second output terminal. The capacitors are connected to the operational amplifier via the controllable switches. The comparison circuit is configured to receive an output signal of the integrator. The control logic circuit is configured to generate a digital signal corresponding to an input voltage signal based on an output signal of the comparison circuit. The controllable switches are controlled to be switched on or switched off to control the analog-to-digital converter to operate in one of a reset mode, a sigma-delta ($\Sigma$-$\Delta$) analog-to-digital conversion mode and a cyclic conversion mode.

In an embodiment, the capacitors include a first offset capacitor and a second offset capacitor. The first offset capacitor is coupled to the first input terminal of the operational amplifier, and the second offset capacitor is coupled to the second input terminal of the operational amplifier. The first offset capacitor and the second offset capacitor are configured to store an offset voltage of the operational amplifier in a first phase. The offset voltage of the operational amplifier is eliminated by counteracting the offset voltage with a voltage across the first offset capacitor and a voltage across the second offset capacitor in a second phase.

In an embodiment, the analog-to-digital converter is reset in a first phase of the reset mode.

In an embodiment, the integrator is configured to, in a second phase of the reset mode of the analog-to-digital converter, sample an input voltage signal and output the sampled input voltage signal.

In an embodiment, the integrator is configured to, in the sigma-delta analog-to-digital conversion mode of the analog-to-digital converter: sample a reference voltage signal and output an integral signal in a last operation cycle; and sample an input voltage signal and a reference voltage signal and output an integral signal in an operation cycle other than the last operation cycle.

In an embodiment, in the sigma-delta analog-to-digital conversion mode of the analog-to-digital converter, an integral signal outputted by the integrator in a last operation cycle is equal to a sum of an integral signal outputted by the integrator in an operation cycle immediately before the last operation cycle and a first signal, and an integral signal outputted by the integrator in an operation cycle other than the last operation cycle is equal to a sum of an integral signal outputted by the integrator in a previous operation cycle, the first signal and an input voltage signal. The first signal is a product of the reference voltage signal and a first coefficient.

In an embodiment, the integrator is configured to, in the cyclic conversion mode of the analog-to-digital converter, amplify an output voltage of the integrator in a previous operation cycle.

In an embodiment, the integrator is configured to, in a first phase of the cyclic conversion mode of the analog-to-digital converter, sample a reference voltage signal and output an integral signal.

In an embodiment, in a second phase of the cyclic conversion mode of the analog-to-digital converter, an integral signal outputted by the integrator in a current operation cycle is equal to a multiple of a sum of an integral signal outputted by the integrator in an operation cycle immediately before the current operation cycle and a first signal. The first signal is a product of the reference voltage signal and the first coefficient.

In an embodiment, in a case that the integrator is configured to receive a positive reference voltage signal in a first phase and receive a negative reference voltage signal in a second phase, the first coefficient is equal to 1. In a case that the integrator is configured to receive a negative reference voltage signal in a first phase and receive a positive reference voltage signal in a second phase, the first coefficient is equal to −1. In a case that the integrator is configured to receive a zero reference signal in a first phase and a second phase, the first coefficient is equal to 0.

In an embodiment, it is determined whether the integrator receives a positive reference voltage signal, a negative reference voltage signal or a zero reference signal in the first phase and the second phase of the current operation cycle based on an output signal of the comparison circuit at an output end of the second phase of the operation cycle immediately before the current operation cycle.

In an embodiment, the capacitors include multiple input capacitors and multiple integral capacitors. The input capacitors include a first input capacitor and a second input capacitor. The integral capacitors include a first integral capacitor, a second integral capacitor, a third integral capacitor and a fourth integral capacitor. The first input capacitor, the first integral capacitor and the second integral capacitor are configured to be coupled to at least one of the first input terminal and the first output terminal of the operational amplifier. The second input capacitor, the third integral capacitor and the fourth integral capacitor are configured to be coupled to at least one of the second input terminal and the second output terminal of the operational amplifier. In the cyclic conversion mode of the analog-to-digital converter, the second integral capacitor is configured to charge the first integral capacitor in a current operation cycle, and the first input capacitor is configured to charge the first integral capacitor in an operation cycle immediately after the current operation cycle, and the fourth integral capacitor is configured to charge the third integral capacitor in the current operation cycle and the second input capacitor is configured to charge the third integral capacitor in the operation cycle immediately after the current operation cycle, to amplify an output voltage of the integrator in the current operation cycle.

In an embodiment, in the cyclic conversion mode of the analog-to-digital converter, in the first phase, each of the first integral capacitor, the second integral capacitor, the third integral capacitor and the fourth integral capacitor is configured to store charges that are stored in the capacitor in an operation cycle immediately before the current operation cycle, and the first input capacitor and the second input capacitor each are configured to discharge. In the second phase, the first integral capacitor is connected between the first input terminal and the first output terminal of the operational amplifier, the third integral capacitor is connected between the second input terminal and the second output terminal of the operational amplifier, the second integral capacitor is configured to charge the first integral capacitor, and the fourth integral capacitor is configured to charge the third integral capacitor, to amplify an output voltage of the operational amplifier. The first input capacitor and the second input capacitor are configured to sample the output voltage of the integrator.

In an embodiment, in the cyclic conversion mode of the analog-to-digital converter, in the first phase, each of the first input capacitor, the second input capacitor, the first integral capacitor and the third integral capacitor is configured to store charges that are stored in the capacitor in the operation cycle immediately before the current operation cycle, and the second integral capacitor and the fourth integral capacitor each are configured to discharge. In the second phase, the first integral capacitor is connected between the first input terminal and the first output terminal of the operational amplifier, the third integral capacitor is connected between the second input terminal and the second output terminal of the operational amplifier, the first input capacitor is configured to charge the first integral capacitor and the second input capacitor is configured to charge the third integral capacitor to amplify an output voltage of the operational amplifier. The second integral capacitor and the fourth integral capacitor are configured to sample the output voltage of the integrator.

In an embodiment, the analog-to-digital converter is configured to sequentially operate in the reset mode, the sigma-delta analog-to-digital conversion mode and the cyclic conversion mode, to perform analog-to-digital conversion.

In an embodiment, the comparison circuit is configured to compare the output signal of the integrator with a first threshold to obtain a first comparison signal and compare the output signal of the integrator with a second threshold to obtain a second comparison signal. The first threshold is greater than the second threshold.

In an embodiment, in the sigma-delta analog-to-digital conversion mode, the first comparison signal is a first high-bit comparison signal, and the second comparison signal is a second high-bit comparison signal.

In an embodiment, in the cyclic conversion mode, the first comparison signal is a first low-bit comparison signal, and the second comparison signal is a second low-bit comparison signal.

In an embodiment, the control logic circuit the control logic circuit is configured to: acquire a first digital signal based on the first high-bit comparison signal and the first low-bit comparison signal; acquire a second digital signal based on the second high-bit comparison signal and the second low-bit comparison signal; and output the digital signal corresponding to the input voltage based on the first digital signal and the second digital signal.

In the technical solutions of the embodiments of the present disclosure, the input capacitors and the integral capacitors are connected to the operational amplifier via the controllable switches, so that the integrator operates in various operation modes. Further, control operation states of the first offset capacitor and the second offset capacitor in the first phase and the second phase of an operation cycle are controlled by switching on or off the controllable switches. Therefore, an offset voltage of the integrator is eliminated, and conversion efficiency and conversion accuracy of the analog-to-digital converter are improved.

BRIEF DESCRIPTION OF THE DRAWINGS

The above and other objects, features and advantages of the present disclosure are clearer by describing the embodiments of the present disclosure with reference to the drawings. In the drawings.

DETAILED DESCRIPTION OF EMBODIMENTS

The present disclosure is described on the basis of the embodiments hereinafter, but is not limited to these embodiments. In the detailed description of the present disclosure hereinafter, numerous specific details are set forth. Those skilled in the art can understand the present disclosure without these specific details. To avoid obscuring the substance of the present disclosure, well-known methods, procedures, processes, elements and circuits are not described in detail herein.

In addition, those skilled in the art should understand that the drawings are provided herein for illustration, and are not necessarily drawn to scale.

In addition, it should be understood that in the following description, the term "circuit" indicates a conductive loop formed by at least one element or sub-circuit through electrical connections or electromagnetic connections. When an element or a circuit is described as being "connected to" another element or an element or a circuit is described as being "connected between" two nodes, the element or the circuit is coupled or connected to another element directly or via other element. The elements may be connected physically, logically, or a combination thereof. In addition, when an element is described as being "directly coupled" or "directly connected" to another element, it indicates that there is no element between the two elements.

Unless otherwise stated, the terms "include", "comprise" or any other variations in the specification are intended to be inclusive, rather than exclusive or exhaustive. That is, the terms indicate "including but not limited to".

In the description of the present disclosure, it should be understood that terms "first", "second" and the like are used only for description and cannot be understood as indicating or implying relative importance. In addition, in the description of the present disclosure, "multiple" means two or more unless otherwise stated.

Figure 1:
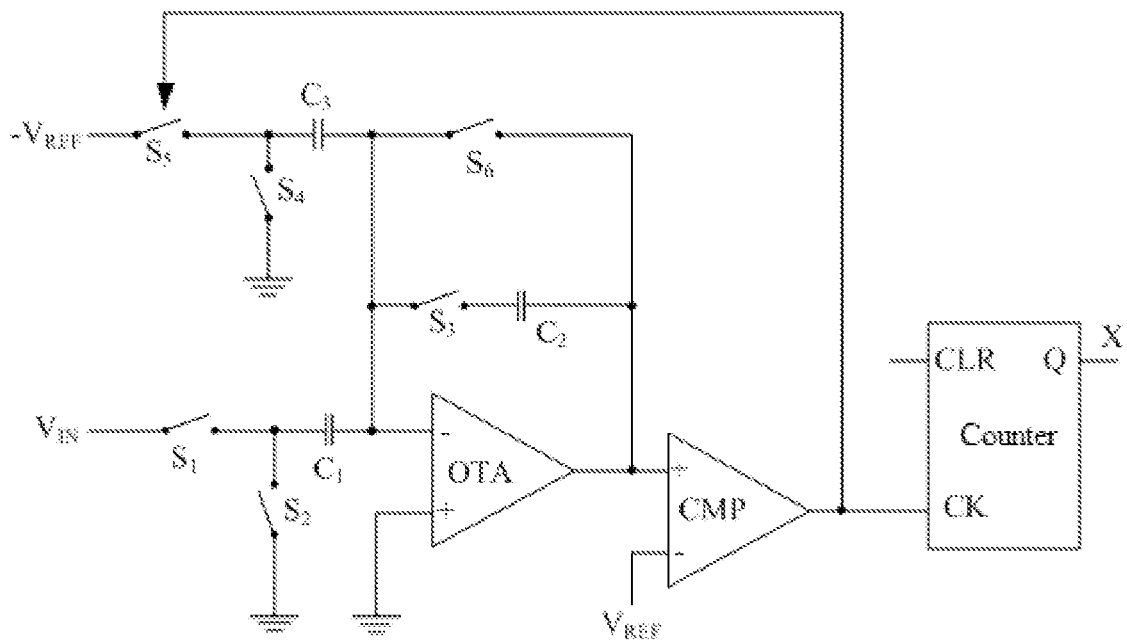
FIG. 1 is a circuit diagram of a Σ-Δ analog-to-digital converter according to the conventional technology.

FIG. 1 is a circuit diagram of a Σ-Δ analog-to-digital converter according to the conventional technology. As shown in FIG. 1, the analog-to-digital converter includes an operational amplifier OTA, a comparator CMP, and a counter. A non-inverting input terminal of the operational amplifier OTA is grounded, and an inverting input terminal of the operational amplifier OTA is connected to capacitors $C_3$ and $C_1$. One terminal of capacitor $C_3$ receives a negative signal $-V_{REF}$ of a reference voltage via a switch $S_5$ and is grounded via a switch $S_4$. One terminal of capacitor $C_1$ receives an input voltage $V_{IN}$ via a switch $S_1$ and is grounded via a switch $S_2$. One terminal of the capacitor $C_2$ is connected to an output terminal of the operational amplifier OTA, and the other terminal of the capacitor $C_2$ is connected to the inverting input terminal of the operational amplifier OTA via a switch $S_3$. The switch $S_6$ short-circuits the output terminal of the operational amplifier OTA and the inverting input terminal of the operational amplifier OTA.

The input voltage $V_{IN}$ is sampled by controlling the switch $S_1$ and the switch $S_6$ to be switched on, so that the capacitor $C_1$ is charged until a voltage of the capacitor $C_1$ is equal to the input voltage $V_{IN}$. Then, charges on the capacitor $C_1$ are transferred to the capacitor $C_2$ by controlling the switches $S_2$ and $S_3$ to be switched on, so that an output signal of the operational amplifier OTA is inputted to an non-inverting input terminal of the comparator CMP. In a case that a gain of the integrator is equal to 1 and a gain of the operational amplifier OTA is infinite, the output signal of the operational amplifier OTA is approximately equal to the input voltage $V_{IN}$. The comparator CMP compares the output signal of the operational amplifier OTA with the reference voltage signal $V_{REF}$. If the comparator outputs a signal at a low level, the number of times stored in the counter remains unchanged. In a next cycle, the input voltage $V_{IN}$ is resampled by controlling the switches $S_1$ and $S_6$ to be switched on. When a voltage of the capacitor $C_1$ is equal to the input voltage $V_{IN}$, charges are transferred from the capacitor $C_1$ to the capacitor $C_2$ by controlling the switches $S_3$ and $S_2$ to be switched on, so that a voltage of the capacitor $C_2$ is approximately equal to twice the input voltage $V_{IN}$. Similarly, in a case that the comparator CMP outputs a signal at a low level, the number of times stored in the counter remains unchanged. The above process is repeated until the comparator CMP outputs a signal at a high level.

Alternatively, in a case that the comparator CMP outputs a signal at a high level, the number of times stored in the counter is increased. In addition, in the case that the comparator CMP outputs a signal at a high level, the switches $S_5$, $S_1$ and $S_6$ are controlled to be switched on to sample the negative signal $-V_{REF}$ of the reference voltage and the input voltage $V_{IN}$, so as to accumulate charges representing the negative signal $-V_{REF}$ of the reference voltage on the capacitor $C_3$ and accumulate charges representing the input voltage $V_{IN}$ on the capacitor $C_1$. The charges on the capacitors $C_3$ and $C_1$ are transferred to the capacitor $C_2$ by controlling the switches $S_3$, $S_4$ and $S_2$ to be switched on. The input voltage $V_{IN}$ is continuously and repeatedly sampled and the negative signal $-V_{REF}$ of the reference voltage is sampled in a case that the comparator CMP outputs a signal at a high level. After N cycles, a voltage caused by residual charges on the capacitor $C_2$ is expressed as: $V=N*V_{IN}-X*V_{REF}$, where X represents the number of times outputted by the counter.

The above process may repeated for a large number of cycles, so that conversion accuracy is improved. However, in a case that a high accuracy is required, conversion efficiency is low. For example, 1024 cycles are required for 10-bit resolution and more than a million cycles are required for 20-bit resolution. Therefore, although the analog-to-digital converter in FIG. 1 can achieve an accurate result, a long period of time spent on conversion is required.

Figure 2:
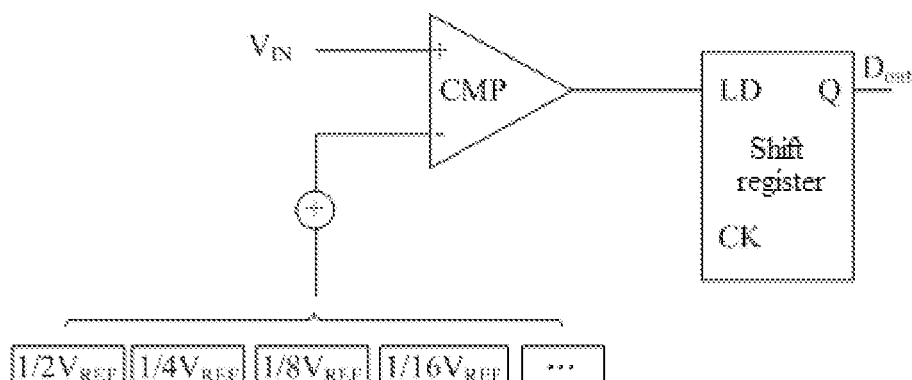
FIG. 2 is a circuit diagram of a successive approximation register (SAR) analog-to-digital converter according to the conventional technology.

FIG. 2 is a circuit diagram of a successive approximation register SAR analog-to-digital converter in the conventional technology. As shown in FIG. 2, the successive approximation register analog-to-digital converter includes a comparator CMP and a shift register. An input voltage $V_{IN}$ is compared with half of a reference voltage $V_{REF}$. In a case that the input voltage $V_{IN}$ is greater than half of the reference voltage $V_{REF}$, the comparator CMP outputs a signal at a high level and logic "1" is shifted to the shift register.

Further, in the case that the previous comparison indicates that the input voltage $V_{IN}$ is less than half of the reference voltage $V_{REF}$, half of the reference voltage $V_{REF}$ is added to a quarter of the reference voltage $V_{REF}$ by an adder to obtain a sum, and the sum is compared with the input voltage $V_{IN}$ by the comparator CMP (that is, the input voltage $V_{IN}$ is compared with three quarters of the voltage reference $V_{REF}$). Similarly, in a case that comparator CMP outputs a signal at a high level, the logic "1" is shifted to the shift register. In a case that comparator CMP outputs a signal at a low level, logic "0" is shifted to the shift register.

Alternatively, in a case that the previous comparison indicates that the input voltage $V_{IN}$ is less than half of the reference voltage $V_{REF}$, a quarter of the reference voltage $V_{REF}$ is subtracted from half of the reference voltage $V_{REF}$ to obtain a difference, and the difference is compared with the input voltage $V_{IN}$ (that is, the input voltage $V_{IN}$ is compared with a quarter of the voltage reference $V_{REF}$). Similarly, in a case that comparator CMP outputs a signal at a high level, the logic "1" is shifted to the shift register. In a case that comparator CMP outputs a signal at a low level, logic "0" is shifted to the shift register.

Therefore, a conversion result with high-resolution is obtained in a short period of time through the above process. Moreover, only one cycle is required for each bit of resolution. For example, ten cycles are required for a ten-bit resolution, and twenty cycles are required for a twenty-bit resolution. However, the reference voltage is susceptible to white noise and bounce noise, resulting in an inaccurate conversion result.

Figure 3:
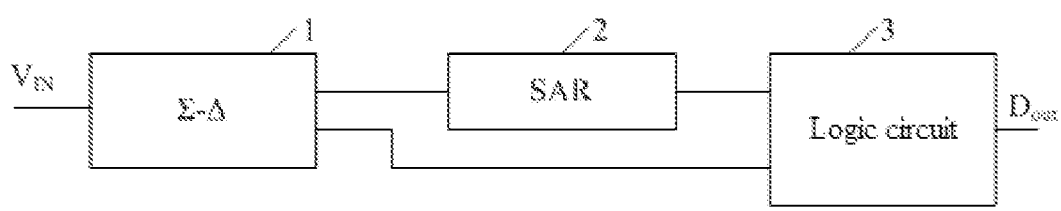
FIG. 3 is a schematic structural diagram of an analog-to-digital converter combining an SAR analog-to-digital converter and a Σ-Δ analog-to-digital converter according to the conventional technology.

FIG. 3 is a schematic structural diagram of an analog-to-digital converter combining an SAR analog-to-digital converter and a Σ-Δ analog-to-digital converter in the conventional technology. As shown in FIG. 3, the analog-to-digital converter includes a Σ-Δ analog-to-digital converter 1, an SAR analog-to-digital converter 2 and a logic circuit 3. The Σ-Δ analog-to-digital converter 1 operates based on the principle of a delta-sigma analog-to-digital converter and is configured to generate a first output result and a residual signal based on an input voltage $V_{IN}$. The SAR analog-to-digital converter 2 operates based on the principle of an SAR analog-to-digital converter and is configured to generate a second output result based on the residual signal. The logic circuit 3 is configured to generate a digital signal corresponding to the input voltage $V_{IN}$ based on the first output result and the second output result.

Further, the logic circuit 3 acquires a high-order conversion result based on the first output result, acquires a low-order conversion result based on the second output result, and combines the high-order conversion result with the low-order conversion result to obtain a digital signal $D_{out}$ corresponding to the input voltage $V_{IN}$.

However, an offset voltage of an operational amplifier is directly superimposed on an output voltage of the operational amplifier in each cycle. In addition, the offset voltage of the operational amplifier varies with a voltage of a power supply and a temperature, so that a temperature feature and a power supply suppression feature of the analog-to-digital converter deteriorates due to the offset voltage of the operational amplifier even if the system calibrates an offset error of the analog-to-digital converter at the room temperature and a typical operation voltage. Moreover, the analog-to-digital converter combining an SAR analog-to-digital converter and a Σ-Δ analog-to-digital converter has high requirements on a direct current gain of the operational amplifier since an error is proportional to a reciprocal of the direct current gain when the operational amplifier operates as a closed loop.

Figure 4:
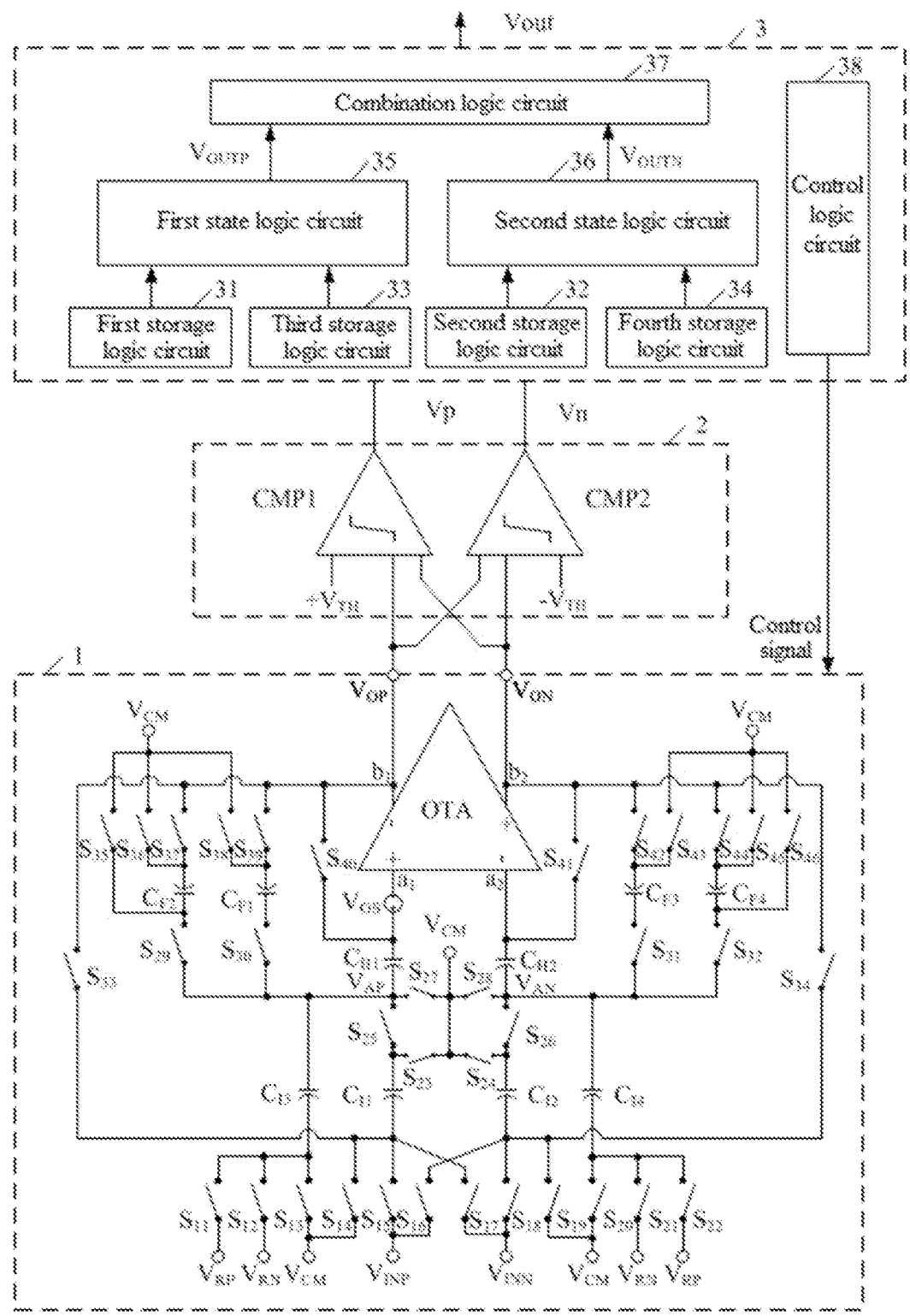
FIG. 4 is a circuit diagram of an analog-to-digital converter according to an embodiment of the present disclosure.

FIG. 4 is a circuit diagram of an analog-to-digital converter according to an embodiment of the present disclosure. As shown in FIG. 4, the analog-to-digital converter according to the embodiment of the present disclosure includes an integrator 1, a comparison circuit 2 and a control logic circuit 3. The integrator 1 is capable of operating in various operation modes. The comparison circuit 2 is configured to receive an output signal of the integrator 1. The control logic circuit 3 is configured to generate a digital signal corresponding to an input voltage based on an output signal of the comparison circuit 2.

In the embodiment, the integrator 1 includes an operational amplifier OTA, multiple offset capacitors, multiple input capacitors, multiple integral capacitors and multiple controllable switches.

In the embodiment, the operational amplifier OTA includes a first input terminal $a_1$, a second input terminal $a_2$, a first output terminal $b_1$ and a second output terminal $b_2$.

In the embodiment, the offset capacitors include a first offset capacitor $C_{H1}$ and a second offset capacitor $C_{H2}$. The first offset capacitor $C_{H1}$ is coupled to the first input terminal $a_1$. The second offset capacitor $C_{H2}$ is coupled to the second input terminal az.

The first offset capacitor and the second offset capacitor store an offset voltage in a first phase. In a second phase, a voltage across the first offset capacitor and a voltage across the second offset capacitor counteract the offset voltage to eliminate the offset voltage of the operational amplifier.

In the embodiment, the input capacitors include a first input capacitor $C_{I1}$, a second input capacitor $C_{I2}$, a third input capacitor $C_{I3}$ and a fourth input capacitor $C_{I4}$. The first input capacitor $C_{I1}$ and the third input capacitor $C_{I3}$ are configured to be coupled to the first input terminal $a_1$ of the operational amplifier OTA. The second input capacitor $C_{I2}$ and the fourth input capacitor $C_{I4}$ are configured to be coupled to the second input terminal $a_2$ of the operational amplifier OTA.

In the embodiment, the integral capacitors include a first integral capacitor $C_{F1}$, a second integral capacitor $C_{F2}$, a third integral capacitor $C_{F3}$ and a fourth integral capacitor $C_{F4}$. The first integral capacitor $C_{F1}$ and the second integral capacitor $C_{F2}$ are configured to be coupled to at least one of the first input terminal $a_1$ and the first output terminal $b_1$ of the operational amplifier OTA. The third integral capacitor $C_{F3}$ and the fourth integral capacitor $C_{F4}$ are configured to be coupled to at least of the first input terminal $a_2$ and the second output terminal $b_2$ of the operational amplifier OTA.

In the embodiment, the controllable switches include switches $S_{11}$ to $S_{46}$.

The switch S ii is connected between a first input terminal $V_{RP}$ of the reference voltage signal and a first terminal of the third input capacitor $C_{I3}$.

The switch $S_{12}$ is connected between a second input terminal $V_{RN}$ of the reference voltage signal and the first terminal of the third input capacitor $C_{I3}$.

The switch $S_{13}$ is connected between an input terminal of a common mode voltage signal $V_{CM}$ and the first terminal of the third input capacitor $C_{I3}$.

The switch $S_{14}$ is connected between the input terminal of the common mode voltage signal $V_{CM}$ and a first terminal of the first input capacitor $C_{I1}$.

The switch $S_{15}$ is connected between a first input terminal $V_{INP}$ of an input voltage signal and the first terminal of the first input capacitor $C_{I1}$.

The switch $S_{16}$ is connected between the first input terminal $V_{INP}$ of the input voltage signal and a first terminal of the second input capacitor $C_{I2}$.

The switch $S_{17}$ is connected between a second input terminal $V_{INN}$ of the input voltage signal and the first terminal of the first input capacitor $C_{I1}$.

The switch $S_{18}$ is connected between the second input terminal $V_{INN}$ of the input voltage signal and the first terminal of the second input capacitor $C_{I2}$.

The switch $S_{19}$ is connected between the input terminal $V_{CM}$ of the common mode voltage signal and the first terminal of the second input capacitor $C_{I2}$.

The switch $S_{20}$ is connected between the input terminal of the common mode voltage signal $V_{CM}$ and a first terminal of the fourth input capacitor $C_{I4}$.

The switch $S_{21}$ is connected between the second input terminal $V_{RN}$ of the reference voltage signal and the first terminal of the fourth input capacitor $C_{I4}$.

The switch $S_{22}$ is connected between the first input terminal $V_{RP}$ of the reference voltage signal and the first terminal of the fourth input capacitor $C_{I4}$.

The switch $S_{23}$ is connected between the input terminal of the common mode voltage signal $V_{CM}$ and a second terminal of the first input capacitor $C_{I1}$.

The switch $S_{24}$ is connected between the input terminal of the common mode voltage signal $V_{CM}$ and a second terminal of the second input capacitor $C_{I2}$.

The switch $S_{25}$ is connected between a first terminal of the first offset capacitor $C_{H1}$ and the second terminal of the first input capacitor $C_{I1}$.

The switch $S_{26}$ is connected between a first terminal of the second offset capacitor $C_{H2}$ and the second terminal of the second input capacitor $C_{I2}$.

The switch $S_{27}$ is connected between the input terminal of the common mode voltage signal $V_{CM}$ and the first terminal of the first offset capacitor $C_{H1}$.

The switch $S_{28}$ is connected between the input terminal of the common mode voltage signal $V_{CM}$ and the first terminal of the second offset capacitor $C_{H2}$.

The switch $S_{29}$ is connected between a first terminal of the second integral capacitor $C_{F2}$ and the second terminal of the third input capacitor $C_{I3}$.

The switch $S_{30}$ is connected between a first terminal of the first integral capacitor $C_{F1}$ and the second terminal of the third input capacitor $C_{I3}$.

The switch $S_{31}$ is connected between a first terminal of the third integral capacitor $C_{F3}$ and the second terminal of the fourth input capacitor $C_{I4}$.

The switch $S_{32}$ is connected between a first terminal of the fourth integral capacitor $C_{F4}$ and the second terminal of the fourth input capacitor $C_{I4}$.

The switch $S_{33}$ is connected between the first output terminal $b_1$ of the operational amplifier and the first terminal of the first input capacitor $C_{I1}$.

The switch $S_{34}$ is connected between the second output terminal $b_2$ of the operational amplifier and the first terminal of the second input capacitor $C_{I2}$.

The switch $S_{35}$ is connected between the input terminal of the common mode voltage signal $V_{CM}$ and the first terminal of the second integral capacitor $C_{F2}$.

The switch $S_{36}$ is connected between the input terminal of the common mode voltage signal $V_{CM}$ and a second terminal of the second integral capacitor $C_{F2}$.

The switch $S_{37}$ is connected between the first output terminal $b_1$ of the operational amplifier and the second terminal of the second integral capacitor $C_{F2}$.

The switch $S_{38}$ is connected between the input terminal of the common mode voltage signal $V_{CM}$ and the second terminal of the first integral capacitor $C_{F1}$.

The switch $S_{39}$ is connected between the first output terminal $b_1$ of the operational amplifier and the second terminal of the first integral capacitor $C_{F1}$.

The switch $S_{40}$ is connected between the first output terminal $b_1$ of the operational amplifier and a second terminal of the first offset capacitor $C_{H1}$.

The switch $S_{41}$ is connected between the second output terminal $b_2$ of the operational amplifier and a second terminal of the second offset capacitor $C_{H2}$.

The switch $S_{42}$ is connected between the second output terminal $b_2$ of the operational amplifier and a second terminal of the third integral capacitor $C_{F3}$.

The switch $S_{43}$ is connected between the input terminal of the common mode voltage signal $V_{CM}$ and the second terminal of the third integral capacitor $C_{F3}$.

The switch $S_{44}$ is connected between the second output terminal $b_2$ of the operational amplifier and a second terminal of the fourth integral capacitor $C_{F4}$.

The switch $S_{45}$ is connected between the input terminal of the common mode voltage signal $V_{CM}$ and the second terminal of the fourth integral capacitor $C_{F4}$.

A switch $S_{46}$ is connected between the input terminal of the common mode voltage signal $V_{CM}$ and a first terminal of the fourth integral capacitor $C_{F4}$.

In the embodiment, the common mode voltage signal $V_{CM}$ has a value from zero to a voltage of a power supply of the analog-to-digital converter.

In the embodiment, the controllable switches are controlled to be switched on or switched off to connect the input capacitors and the integral capacitors to the operational amplifier or to disconnect the input capacitors and the integral capacitors from the operational amplifier, so as to control operation modes of the integrator and the analog-to-digital converter.

In the embodiment, the controllable switches are controlled to be switched on or switched off to control the integrator 1 to operate in one of a return-to-zero mode, a first integral mode and a second integral mode. Further, in a case that the integrator 1 operates in the return-to-zero mode, the analog-to-digital converter operates in a reset mode. In a case that the integrator 1 operates in the first integral mode, the analog-to-digital converter operates in a sigma-delta analog-to-digital conversion mode. In a case that the integrator 1 operates in the second integral mode, the analog-to-digital converter operates in a cyclic conversion mode.

In the embodiment, in a case that the integrator operates in the return-to-zero mode, the integrator is reset.

Further, in a case that the integrator operates in the return-to-zero mode, the integrator is configured to sample an input voltage signal and output the sampled input voltage signal. Further, in the return-to-zero mode, the integrator serves as a sampling holder.

In the embodiment, in a case that the integrator operates in the first integral mode, in a last operation cycle, the integrator samples the reference voltage signal and outputs an integral signal. In an operation cycle other than the last operation cycle, the integrator samples the input voltage signal and the reference voltage signal and outputs an integral signal.

Further, in a case that the integrator operates in the first integral mode, the integral signal outputted by the integrator in the last operation cycle is equal to a sum of an integral signal outputted by the integrator in an operation cycle immediately before the last operation cycle and a first signal. An integral signal outputted by the integrator in the operation cycle other than the last operation cycle is equal to a sum of an integral signal outputted by the integrator in a previous operation cycle, the first signal and the input voltage signal. The first signal is a product of the reference voltage signal and a first coefficient.

In the embodiment, in a case that the integrator operates in the second integral mode, an output voltage of the integrator in an operation cycle immediately before the current operation cycle is amplified.

Further, in a case that the integrator operates in the second integral mode, the integrator is configured to sample the reference voltage signal and output an integral signal.

Further, in a case that the integrator operates in the second integral mode, the integral signal outputted by the integrator is equal to a multiple of a sum of the first signal and an integral signal outputted by the integrator in an operation cycle immediately before the current operation cycle. The first signal is a product of the reference voltage signal and the first coefficient.

Further, in a case that the integrator receives a positive reference voltage signal in the first phase and receives a negative reference voltage signal in the second phase, the first coefficient is equal to 1.

In a case that the integrator receives a negative reference voltage signal in the first phase and receives a positive reference voltage signal in the second phase, the first coefficient is equal to −1.

In a case that the integrator receives a zero reference signal in the first phase and the second phase, the first coefficient is equal to 0.

In the embodiment, the reference voltage may be positive, negative or zero, so that the analog-to-digital converter serves as a bidirectional converter. That is, an input signal of the analog-to-digital converter may be positive or negative. In other embodiments, the reference signal is positive and the first coefficient is equal to 1. In this case, the analog-to-digital converter serves as a unidirectional converter. That is, the analog-to-digital converter converts only a positive input signal. In other embodiments, the reference signal is negative and the first coefficient is equal to −1. In this case, the analog-to-digital converter serves as a unidirectional converter. That is, the analog-to-digital converter converts only a negative input signal. The reference signal and the first coefficient are not limited in the present disclosure.

Further, whether the integrator receives a positive reference voltage signal, a negative reference voltage signal or a zero reference signal in the first phase and the second phase of a current operation cycle is determined based on an output signal of the comparison circuit at an output end of the second phase of the operation cycle immediately before the current operation cycle.

In analog-to-digital conversion, the analog-to-digital converter sequentially operates in the reset mode, the sigma-delta analog-to-digital conversion mode and the cyclic conversion mode, to perform analog-to-digital conversion. Correspondingly, the integrator 1 sequentially operates in the return-to-zero mode, the first integral mode and the second integral mode. It should be noted that the integrator 1 is further applicable to a scenario other than the analog-to-digital converter. Therefore, in other embodiments, the integrator 1 operates in these modes separately or operate in these modes in any order, and unnecessarily operates in the above three modes sequentially, which is not limited in the present disclosure. For example, in a case that the integrator serves as a sampling holder, the integrator operates in only the zero-return mode. In a case that the integrator is configured to integrate a current, the integrator operates in only the first integral mode or sequentially operates in the first integral mode and the second integral mode.

In the analog-to-digital conversion, the integrator 1 operates in the return-to-zero mode in a first cycle, and operates in the first integral mode for n cycles, and finally operates in the second integral mode for m cycles, where n and m are greater than or equal to 1.

Further, in the first integral mode, the analog-to-digital converter generates a first result and residual charges. The residual charges are stored in the four integral capacitors. In the second integral mode, the analog-to-digital converter receives the residual charges and generates a second result, and outputs a digital signal corresponding to the input voltage based on the first result and the second result.

Further, in a case that an accuracy of the analog-to-digital conversion is determined, conversion accuracy of the first integral mode and conversion accuracy of the second integral mode are determined based on balance between accuracy and efficiency, so as to determine the number of operation cycles of the integrator 1 in each mode.

For example, in a case that the accuracy of the analog-to-digital conversion is 2N, if the conversion accuracy of the analog-to-digital converter in the first integral mode and the conversion accuracy of the analog-to-digital converter in the second integral mode are respectively set to be N, the number of operation cycles of the analog-to-digital converter operating in the first integral mode is equal to $2^N$ and the number of operation cycles of the analog-to-digital converter operating in the second integral mode is equal to N.

Further, in any operation mode of the integrator, each cycle includes two phases. The integrator includes an offset capacitor, which is configured to store the offset voltage of the operational amplifier in the first phase. The voltage of the offset capacitor counteracts the offset voltage of the operational amplifier in the second phase, so that the integrator can eliminate the offset voltage of the operational amplifier in any operation mode.

In the embodiment, the comparison circuit 2 is configured to generate a high-bit comparison signal in the first integral mode and generate a low-bit comparison signal in the second integral mode.

Further, the comparison circuit 2 is configured to compare the output signal of the integrator with a first threshold to obtain a first comparison signal, and compare the output signal of the integrator with a second threshold to obtain a second comparison signal. The first threshold is greater than the second threshold.

In a case that the integrator operates in the first integral mode, the first comparison signal and the second comparison signal are a first high-bit comparison signal and a second high-bit comparison signal respectively. In a case that the integrator operates in the second integral mode, the first comparison signal and the second comparison signal are a first low-bit comparison signal and a second low-bit comparison signal respectively.

In the embodiment, the comparison circuit 2 includes a first comparator CMP1 and a second comparator CMP2. An output signal of the first comparator CMP1 is referred to as a first comparison signal, and an output signal of the second comparator CMP2 is referred to as a second comparison signal. In other embodiments, the first comparison signal and the second comparison signal are outputted by a comparator with two thresholds (for example, a hysteresis comparator), which is not limited in the present disclosure.

In the embodiment, the control logic circuit 3 includes a first storage logic circuit 31, a second storage logic circuit 32, a third storage logic circuit 33, a fourth storage logic circuit 34, a first state logic circuit 35, a second state logic circuit 36 and a combination logic circuit 37.

Input terminals of the first comparator CMP1 receive a first threshold +$V_{TH}$, an output voltage $V_{OP}$ of the first output terminal $b_1$ of the operational amplifier OTA, and an output voltage $V_{ON}$ of the second output terminal $b_2$ of the operational amplifier OTA. In the first integral mode, the first comparator CMP1 outputs a first high-bit comparison signal, and the first high-bit comparison signal is stored in the first storage logic circuit 31. In the second integral mode, the first comparator CMP1 outputs a first low-bit comparison signal, and the first low-bit comparison signal is stored in the third storage logic circuit 33.

Input terminals of the second comparator CMP2 receive a second threshold -$V_{TH}$, the output voltage $V_{OP}$ of the first output terminal $b_1$ of the operational amplifier OTA, and the output voltage $V_{ON}$ of the second output terminal $b_2$ of the operational amplifier OTA. In the first integral mode, the second comparator CMP2 outputs a second high-bit comparison signal, and the second high-bit comparison signal is stored in the second storage logic circuit 32. In the second integral mode, the second comparator CMP2 outputs a second low-bit comparison signal, and the second low-bit comparison signal is stored in the fourth storage logic circuit 34.

Further, the first comparator compares ($V_{OP}$-$V_{ON}$) with the first threshold +$V_{TH}$ to output the first comparison signal. The second comparator compares ($V_{OP}$-$V_{ON}$) with the second threshold -$V_{TH}$ to output the second comparison signal.

In an embodiment, an inverting input terminal of the first comparator CMP1 receives the first threshold +$V_{TH}$, and a non-inverting input terminal of the second comparator CMP2 receives the second threshold -$V_{TH}$.

In a case that ($V_{OP}$-$V_{ON}$) is greater than +$V_{TH}$, the first comparison signal is at a high level and the second comparison signal is at a low level.

In a case that ($V_{OP}$-$V_{ON}$) is greater than or equal to -$V_{TH}$ and is less than or equal to +$V_{TH}$, the first comparison signal is at a low level and the second comparison signal is at a low level.

In a case that ($V_{OP}$-$V_{ON}$) is less than -$V_{TH}$, the first comparison signal is at a low level and the second comparison signal is at a high level.

Further, the first state logic circuit 35 acquires a first digital signal $V_{OUTP}$ based on all first high-bit comparison signals stored in the first storage logic circuit 31 and all first low-bit comparison signals stored in the third storage logic circuit 33.

Further, the second state logic circuit 36 acquires a second digital signal $V_{OUTN}$ based on all second high-bit comparison signals stored in the second storage logic circuit 32 and all second low-bit comparison signals stored in the fourth storage logic circuit 34.

In the embodiment, the combination logic circuit 37 outputs a digital signal $V_{OUT}$ corresponding to the input voltage based on the first digital signal $V_{OUTP}$ and the second digital signal $V_{OUTN}$.

Further, the control logic circuit 3 further includes a control logic circuit 38. The control logic circuit 38 is configured to generate a control signal, for controlling the multiple switches to be switched on or switched off, to control the multiple capacitors to be charged or discharge, so as to control the integrator 1 to operate in the return-to-zero mode, the first integral mode or the second integral mode.

Figure 5:
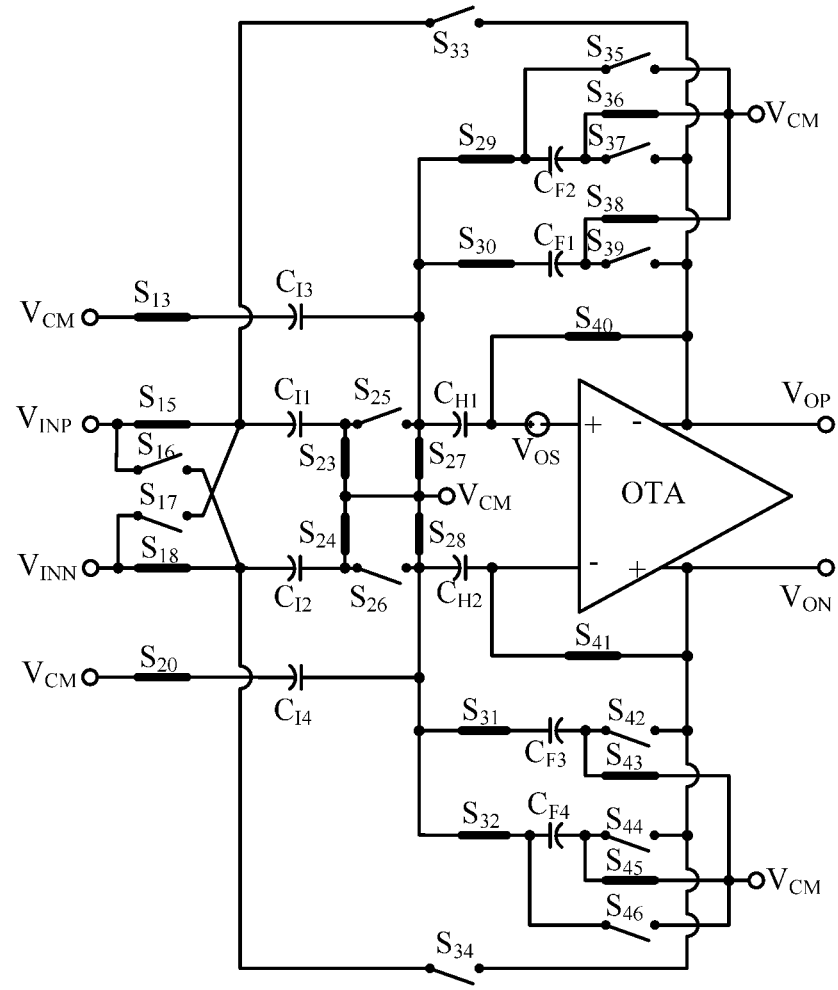
FIG. 5 is a circuit diagram of the integrator operating in a first phase of a return-to-zero mode according to an embodiment of the present disclosure.
Figure 6:
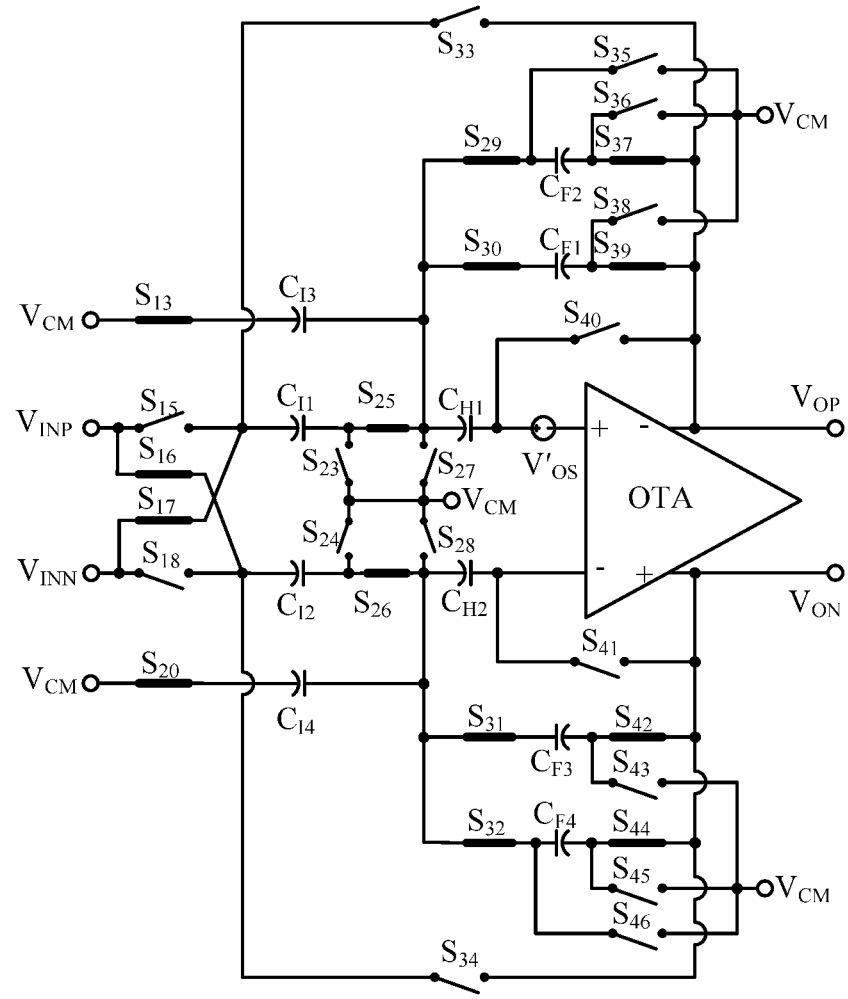
FIG. 6 is a circuit diagram of the integrator operating in a second phase of the return-to-zero mode according to an embodiment of the present disclosure.

FIG. 5 and FIG. 6 are circuit diagrams of the integrator operating in the return-to-zero mode according to an embodiment of the present disclosure. Each operation cycle of the integrator 1 includes a first phase and a second phase. FIG. 5 is a circuit diagram of the integrator operating in the first phase of the return-to-zero mode. As shown in FIG. 5, the switches $S_{13}$, $S_{15}$, $S_{18}$, $S_{20}$, $S_{23}$, $S_{24}$, $S_{27}$, $S_{28}$, $S_{29}$, $S_{30}$, $S_{31}$, $S_{32}$, $S_{36}$, $S_{38}$, $S_{40}$, $S_{41}$, $S_{43}$, and $S_{45}$ are controlled to be switched on, to control the integrator to operate in the first phase of the return-to-zero mode.

FIG. 6 is a circuit diagram of the integrator operating in the second phase of the return-to-zero mode. As shown in FIG. 6, the switches $S_{13}$, $S_{16}$, $S_{17}$, $S_{20}$, $S_{25}$, $S_{26}$, $S_{29}$, $S_{30}$, $S_{31}$, $S_{32}$, $S_{37}$, $S_{39}$, $S_{42}$ and $S_{44}$ are controlled to be switched on, to control the integrator to operate in the second phase of the return-to-zero mode.

Further, as can be seen from FIG. 5 and FIG. 6, in the return-to-zero mode, in a case of $C_{IN}=C_{I1}=C_{I2}$, $C_R=C_{I3}=C_{I4}$, $C_H=C_{H1}=C_{H2}$ and $C_F=C_{F1}=C_{F2}=C_{F3}=C_{F4}$, the output signal of the operational amplifier OTA in the second phase is expressed as:

$$V'_{OP}(i) - V'_{ON}(i) = \frac{C_{IN}}{C_F}[V_{INP}(i) - V_{INN}(i)] + \frac{C_{IN} + 2C_F + C_R}{2C_F}(V'_{OS} - V_{OS})$$

In the above equation, $V'_{OP}(i)$ and $V'_{ON}(i)$ respectively represent a voltage of the first output terminal of the operational amplifier and a voltage of the second output terminal of the operational amplifier in the second phase. $V_{INP}(i)$ and $V_{INN}(i)$ respectively represent a positive signal of the input voltage and a negative signal of the input voltage in an (i)th period. $V_{OS}$ and $V'_{OS}$ respectively represent an offset voltage of the analog-to-digital converter in the first phase and an offset voltage of the analog-to-digital converter in the second phase.

Further, in a case of $C_{IN}=C_R=C_F$ and $V_{OS}=V'_{OS}$, the above equation is transformed into:

$$V'_{OP}(i)-V'_{ON}(i)=[V_{INP}(i)-V_{INN}(i)]$$

It can be seen from the above equation that the offset voltage of the operational amplifier is eliminated by switching between two phases, and the input signal is sampled and is stored in the integral capacitors.

In the return-to-zero mode, the integrator is configured as an auto-zeroed sampling hold circuit. The integral capacitors $C_{F1}$, $C_{F2}$, $C_{F3}$ and $C_{F4}$ are cleared in the first phase, and samples the input voltage signal and stores the sampled input voltage signal in the second phase. The offset capacitors store the offset voltage of the operational amplifier in the first phase. The voltages of the offset capacitors counteract the offset voltage of the operational amplifier in the second phase, so that the integrator can eliminate the offset voltage of the operational amplifier in the return-to-zero mode.

Therefore, the offset voltage and low frequency noise of the operational amplifier can be eliminated, thereby improving the accuracy of the analog-to-digital converter.

Figure 7:
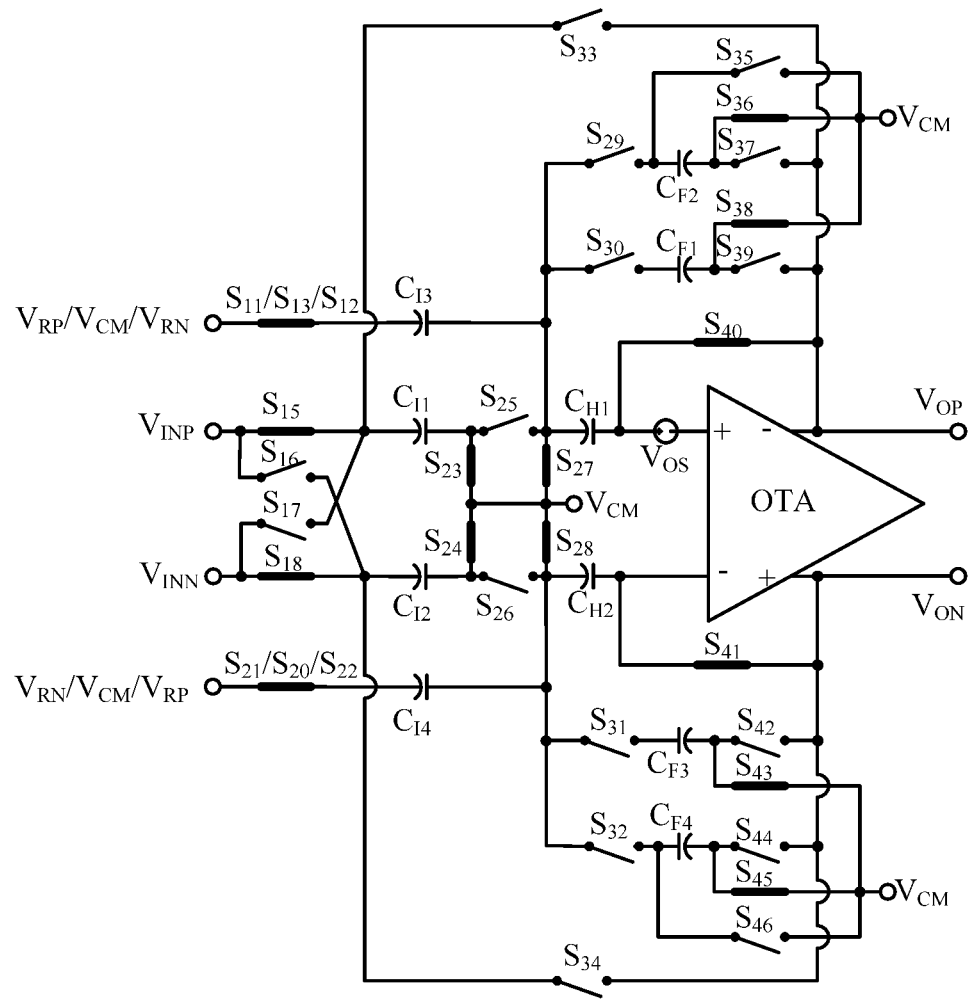
FIG. 7 is a circuit diagram of the integrator operating in a first phase of a first integral mode according to an embodiment of the present disclosure.
Figure 8:
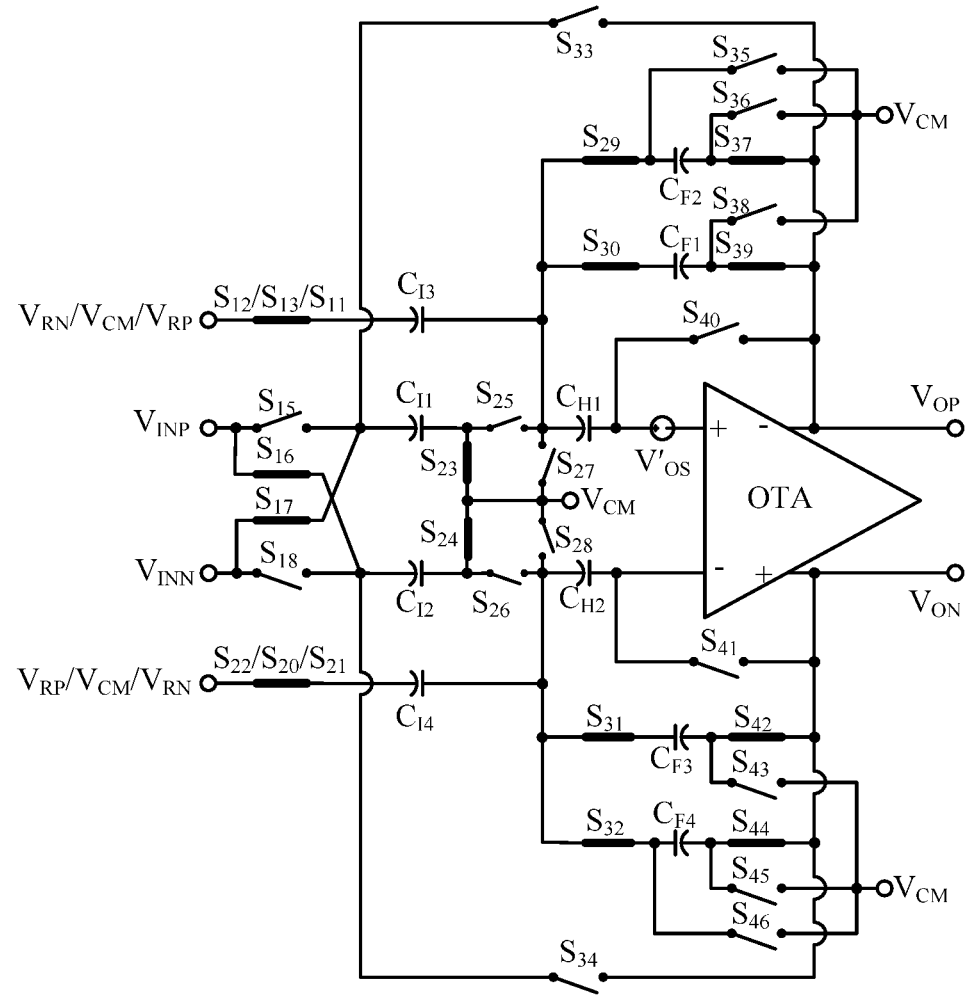
FIG. 8 is a circuit diagram of the integrator operating in a second phase of the first integral mode according to an embodiment of the present disclosure.

FIG. 7 is a circuit diagram of the integrator operating in a first phase of the first integral mode according to an embodiment of the present disclosure. FIG. 8 is a circuit diagram of the integrator operating in a second phase of the first integral mode according to an embodiment of the present disclosure. As shown in FIG. 7 and FIG. 8, it is assumed that the predetermined number of cycles for the first integral mode is equal to N, the integrator in controlled, in any of the following three manners, to operate in first (N−1) cycles of the first integral mode. Each cycle includes a first phase and a second phase.

In a first manner, the switches $S_{11}$, $S_{15}$, $S_{18}$, $S_{21}$, $S_{23}$, $S_{24}$, $S_{27}$, $S_{28}$, $S_{36}$, $S_{38}$, $S_{40}$, $S_{41}$, $S_{43}$, and $S_{45}$ are controlled to be switched on, to control the integrator to operate in the first phase of the first (N−1) cycles of the first integral mode.

In addition, the switches $S_{12}$, $S_{16}$, $S_{17}$, $S_{22}$, $S_{23}$, $S_{24}$, $S_{29}$, $S_{30}$, $S_{31}$, $S_{32}$, $S_{37}$, $S_{39}$, $S_{42}$, and $S_{44}$ are controlled to be switched on, to control the integrator to operate in the second phase the first (N−1) cycles of the first integral mode.

In a second manner, the switches $S_{13}$, $S_{15}$, $S_{18}$, $S_{20}$, $S_{23}$, $S_{24}$, $S_{27}$, $S_{28}$, $S_{36}$, $S_{38}$, $S_{40}$, $S_{41}$, $S_{43}$, and $S_{45}$ are controlled to be switched on, to control the integrator to operate in the first phase of the first (N−1) cycles of the first integral mode.

In addition, the switches $S_{13}$, $S_{16}$, $S_{17}$, $S_{20}$, $S_{23}$, $S_{24}$, $S_{29}$, $S_{30}$, $S_{31}$, $S_{32}$, $S_{37}$, $S_{39}$, $S_{42}$ and $S_{44}$ are controlled to be switched on, to control the integrator to operate in the second phase of the first (N−1) cycles of the first integral mode.

In a third manner, the switches $S_{12}$, $S_{15}$, $S_{18}$, $S_{22}$, $S_{23}$, $S_{24}$, $S_{27}$, $S_{28}$, $S_{36}$, $S_{38}$, $S_{40}$, $S_{41}$, $S_{43}$, and $S_{45}$ are controlled to be switched on, to control the integrator to operate in the first phase of the first (N−1) cycles of the first integral mode.

In addition, the switches $S_{11}$, $S_{16}$, $S_{17}$, $S_{21}$, $S_{23}$, $S_{24}$, $S_{29}$, $S_{30}$, $S_{31}$, $S_{32}$, $S_{37}$, $S_{39}$, $S_{42}$, and $S_{44}$ are controlled to be switched on, to control the integrator to operate in the second phase of the first (N−1) cycles of the first integral mode.

Further, as can be seen from FIG. 7 and FIG. 8, in the first integral mode, in a case of $C_{IN}=C_{I1}=C_{I2}$, $C_R=C_{I3}=C_{I4}$, $C_H=C_{H1}=C_{H2}$, and $C_F=C_{F1}=C_{F2}=C_{F3}=C_{F4}$, the output signal of the operational amplifier OTA in the second phase is expressed as:

$$V'_{OP}(i) - V'_{ON}(i) = \frac{C_{IN}}{C_F}[V_{INP}(i) - V_{INN}(i)] + D(i)\frac{C_R}{C_F}[V_{RP}(i) - V_{RN}(i)] + \frac{C_{IN} + 2C_F + C_R}{2C_F}(V'_{OS} - V_{OS}) + [V'_{OP}(i-1) - V'_{ON}(i-1)]$$

In the above equation, i is greater than or equal to 1 and is less than or equal to (N−1). $V'_{OP}(i)$ and $V'_{ON}(i)$ respectively represent a voltage of the first output terminal of the operational amplifier and a voltage of the second output terminal of the operational amplifier in the second phase of the (i)th cycle. $V_{INP}(i)$ and $V_{INN}(i)$ respectively represent a positive signal and a negative signal of the input voltage in the (i)th cycle. D(i) is determined based on an output result of the comparator at an output end of the second phase of the (i−1)th cycle. $V_{RN}(i)$ and $V_{RN}(i)$ respectively represent a positive signal and a negative signal of the reference voltage in the (i)th cycle. $V_{OS}$ and $V'_{OS}$ respectively represent an offset voltage of the analog-to-digital converter in the first phase and an offset voltage of the analog-to-digital converter in the second phase. $V'_{OP}(i-1)$ and $V'_{ON}(i-1)$ respectively represent a voltage of the first output terminal of the operational amplifier and a voltage of the second output terminal of the operational amplifier in the second phase of the (i−1)th cycle.

Further, in a case of $C_{IN}=C_R=C_F$ and $V_{OS}=V'_{OS}$, the above equation is transformed into:

$$V'_{OP}(i)-V'_{ON}(i)=[V_{INP}(i)-V_{INN}(i)]+D(i)[V_{RP}(i)-V_{RN}(i)]+[V'_{OP}(i-1)-V'_{ON}(i-1)]$$

It can be seen from the above equation that in the first (N−1) cycles of the first integral mode, the integrator samples the input voltage signal and the reference voltage signal and outputs the integral signal. The integral signal is a differential output signal of the operational amplifier OTA. That is, in the first integral mode, in the second phase of each cycle other than the last cycle, the output signal of the operational amplifier OTA is equal to a sum of the differential output signal of the operational amplifier OTA in an operation cycle immediately before the cycle, the input voltage signal and the first signal. The first signal is a product of the reference voltage signal and the first coefficient. The first coefficient is expressed as D(i).

Further, in a case that i is equal to 1, $V'_{OP}(i-1)$ and $V'_{ON}(i-1)$ are equal to zero.

Further, in a case that the integrator receives a positive reference voltage signal ($V_{RP}-V_{RN}$) in the first phase (in this case, the third input capacitor $C_{I3}$ receives a positive signal $V_{RP}$ of the reference voltage and the fourth input capacitor $C_{I4}$ receives the negative signal $V_{RN}$ of the reference voltage) and receives a negative reference voltage signal ($V_{RN}$–$V_{RP}$) in the second phase (in this case, the third input capacitor $C_{I3}$ receives the negative signal $V_{RN}$ of the reference voltage and the fourth input capacitor $C_{I4}$ receives the positive signal $V_{RP}$ of the reference voltage), the first coefficient D(i) is equal to 1.

In a case that the integrator receives the negative reference voltage signal ($V_{RN}$–$V_{RP}$) in the first phase (in this case, the third input capacitor $C_{I3}$ receives the negative signal $V_{RN}$ of the reference voltage and the fourth input capacitor $C_{I4}$ receives the positive signal $V_{RP}$ of the reference voltage) and receives the positive reference voltage signal ($V_{RP}$–$V_{RN}$) in the second phase (in this case, the third input capacitor $C_{I3}$ receives the positive signal $V_{RP}$ of the reference voltage and the fourth input capacitor $C_{I4}$ receives the negative signal $V_{RN}$ of the reference voltage), the first coefficient D(i) is equal to –1.

In a case that the integrator receives a zero reference signal in both the first phase and the second phase (in this case, the third input capacitor $C_{I3}$ receives a common mode voltage signal $V_{CM}$ and the fourth input capacitor $C_{I4}$ receives the common mode voltage signal $V_{CM}$), the first coefficient D(i) is equal to 0.

Further, whether the integrator receives a positive reference voltage signal, a negative reference voltage signal or a zero reference signal in the first phase and the second phase of a current operation cycle is determined based on an output signal of the comparison circuit at an output end of the second phase of the operation cycle immediately before the current operation cycle, so as to determine the first coefficient D(i) based on the output signal of the comparison circuit at the output end of the second phase of the operation cycle immediately before the current operation cycle.

Further, D(i) is determined based on the output signal of the comparison circuit at the output end of the second phase of the (i–1)th cycle by: determining D(i) to be 1 in a case that the output signal of the first comparator is at a low level and the output signal of the second comparator is at a high level; determining D(i) to be 0 in a case that the output signal of the first comparator is at a low level and the output signal of the second comparator is at a low level; and determining D(i) to be –1 in a case that the output signal of the first comparator is at a high level and the output signal of the second comparator is at a high level.

Further, the first comparator compares ($V_{OP}$–$V_{ON}$) with the first threshold +$V_{TH}$ to output a first comparison signal. The second comparator compares ($V_{OP}$–$V_{ON}$) with the second threshold –$V_{TH}$ to output a second comparison signal.

In a case that ($V_{OP}$–$V_{ON}$) is greater than +$V_{TH}$, the first comparison signal is at a high level and the second comparison signal is at a low level.

In a case that ($V_{OP}$–$V_{ON}$) is greater than or equal to –$V_{TH}$ and is less than or equal to +$V_{TH}$, the first comparison signal is at a low level and the second comparison signal is at a low level.

In a case that ($V_{OP}$–$V_{ON}$) is less than –$V_{TH}$, the first comparison signal is at a low level and the second comparison signal is at a high level.

Figure 9:
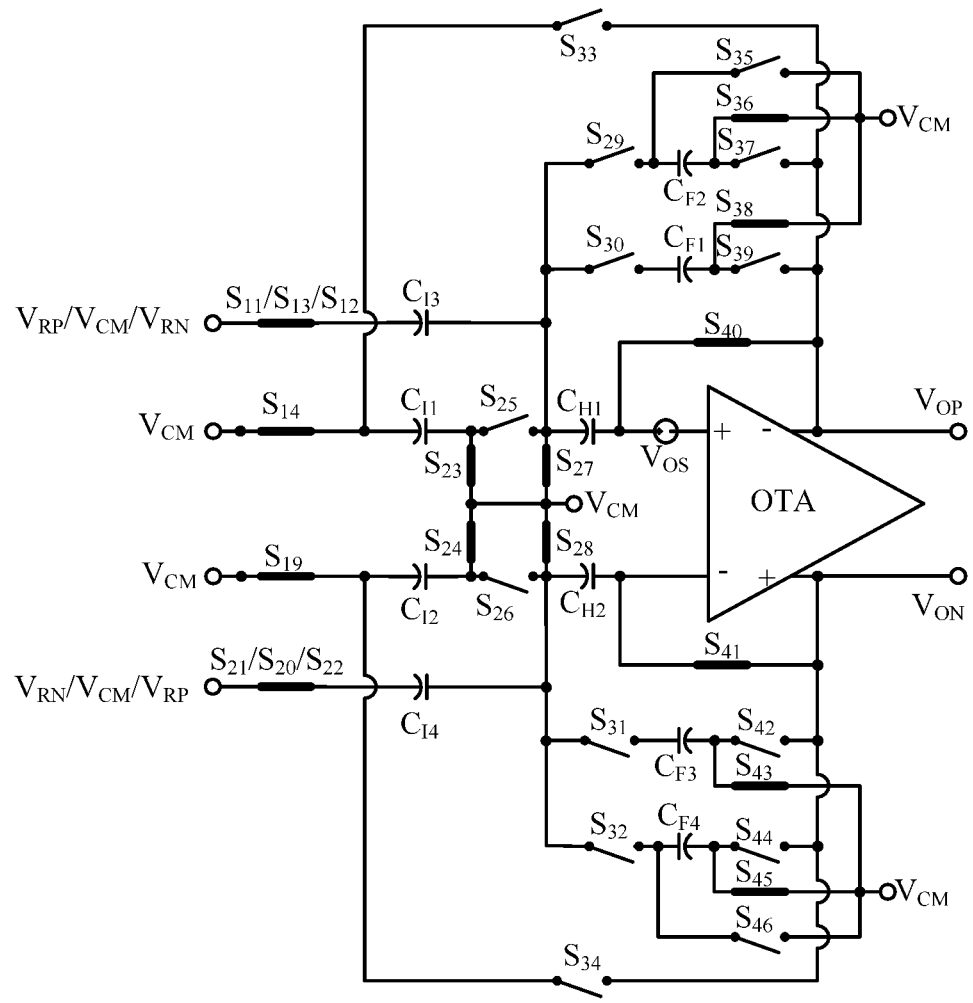
FIG. 9 is a circuit diagram of the integrator operating in the first phase of the first integral mode according to an embodiment of the present disclosure.
Figure 10:
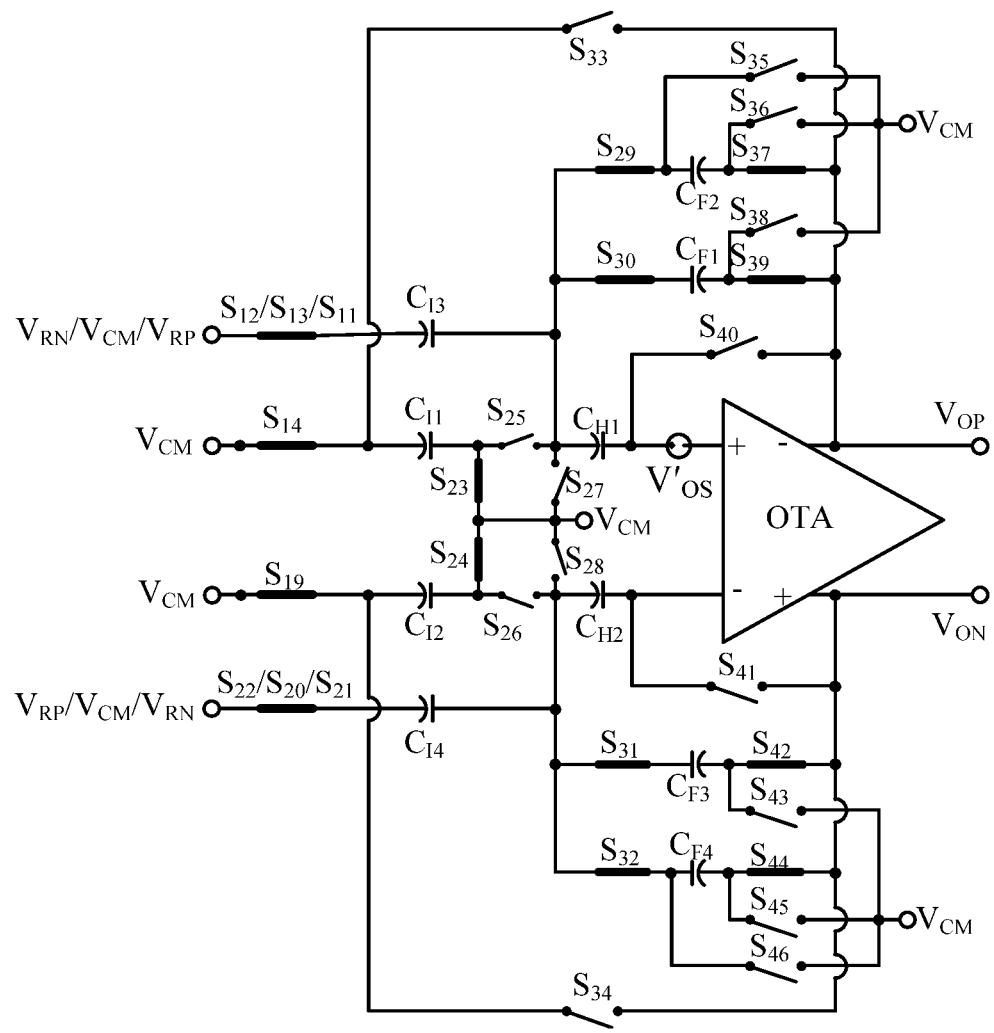
FIG. 10 is a circuit diagram of the integrator operating in the second phase of the first integral mode according to an embodiment of the present disclosure.

FIG. 9 is a circuit diagram of an integrator operating in the first phase of the first integral mode according to an embodiment of the present disclosure. FIG. 10 is a circuit diagram of an integrator operating in the second phase of the first integral mode according to an embodiment of the present disclosure. As shown in FIG. 9 and FIG. 10, the analog-to-digital converter is controlled, in the following three manners, to operate in the (N)th cycle of the first integral mode.

In a first manner, the switches $S_{11}$, $S_{14}$, $S_{19}$, $S_{21}$, $S_{23}$, $S_{24}$, $S_{27}$, $S_{28}$, $S_{36}$, $S_{38}$, $S_{40}$, $S_{41}$, $S_{43}$, and $S_{45}$ are controlled to be switched on, to control the integrator to operate in the first phase of the last cycle of the first integral mode.

In addition, the switches $S_{12}$, $S_{14}$, $S_{19}$, $S_{22}$, $S_{23}$, $S_{24}$, $S_{29}$, $S_{30}$, $S_{31}$, $S_{32}$, $S_{37}$, $S_{39}$, $S_{42}$, and $S_{44}$ are controlled to be switched on, to control the integrator to operate in the second phase of the last cycle of the first integral mode.

In a second manner, the switches $S_{13}$, $S_{14}$, $S_{19}$, $S_{20}$, $S_{23}$, $S_{24}$, $S_{27}$, $S_{28}$, $S_{36}$, $S_{38}$, $S_{40}$, $S_{41}$, $S_{43}$, and $S_{45}$ are controlled to be switched on, to control the integrator to operate in the first phase of the last cycle of the first integral mode.

In addition, the switches $S_{13}$, $S_{14}$, $S_{19}$, $S_{20}$, $S_{23}$, $S_{24}$, $S_{29}$, $S_{30}$, $S_{31}$, $S_{32}$, $S_{37}$, $S_{39}$, $S_{42}$, and $S_{44}$ are controlled to be switched on, to control the integrator to operate in the second phase of the last cycle of the first integral mode.

In the third manner, the switches $S_{12}$, $S_{14}$, $S_{19}$, $S_{22}$, $S_{23}$, $S_{24}$, $S_{27}$, $S_{28}$, $S_{36}$, $S_{38}$, $S_{40}$, $S_{41}$, $S_{43}$, and $S_{45}$ are controlled to be switched on, to control the integrator to operate in the first phase of the last cycle of the first integral mode.

In addition, the switches $S_{11}$, $S_{14}$, $S_{19}$, $S_{21}$, $S_{23}$, $S_{24}$, $S_{29}$, $S_{30}$, $S_{31}$, $S_{32}$, $S_{37}$, $S_{39}$, $S_{42}$, and $S_{44}$ are controlled to be switched on, to control the integrator to operate in the second phase of the last cycle of the first integral mode.

Further, it can be seen from FIG. 9 and FIG. 10 that in the (N)th cycle of the first integral mode, in a case of $C_{IN}=C_{I1}=C_{I2}$, $C_R=C_{I3}=C_{I4}$, $C_H=C_{H1}=C_{H2}$, and $C_F=C_{F1}=C_{F2}=C_{F3}=C_{F4}$, the output signal of the operational amplifier OTA in the second phase is expressed as:

$$V'_{OP}(N) - V'_{ON}(N) = D(N)\frac{C_R}{C_F}[V_{RP}(N) - V_{RN}(N)] + \frac{C_{IN} + 2C_F + C_R}{2C_F}(V'_{OS} - V_{OS}) + [V'_{OP}(N-1) - V'_{ON}(N-1)]$$

In the above equation, $V'_{OP}(N)$ and $V'_{ON}(N)$ respectively represent a voltage of the first output terminal of the operational amplifier and a voltage of the second output terminal of the operational amplifier in the second phase of the (N)th cycle. D(N) is determined based on the output result of the comparator at the output end of the second phase of the (N–1)th cycle. $V_{RP}(N)$ and $V_{RN}(N)$ respectively represent a positive signal and a negative signal of the reference voltage in the (N)th cycle. $V_{OS}$ and $V'_{OS}$ respectively represent the offset voltage of the analog-to-digital converter in the first phase and the offset voltage of the analog-to-digital converter in the second phase. $V'_{OP}(N-1)$ and $V'_{ON}(N-1)$ respectively represent a voltage of the first output terminal of the operational amplifier and a voltage of the second output terminal of the operational amplifier in the second phase of the (N–1)th cycle.

Further, in a case of $C_{IN}=C_R=C_F$ and $V_{OS}=V'_{OS}$, the above equation is transformed into:

$$V'_{OP}(N) - V'_{ON}(N) = D(N)[V_{RP}(N) - V_{RN}(N)] + [V'_{OP}(N-1) - V'_{ON}(N-1)]$$

It can be seen from the above equation that in the (N)th cycle of the first integral mode, the integrator does not sample the input voltage signal and superimposes the first signal on the output signal of the operation cycle immediately before the current operation cycle. The first signal is a product of the reference voltage signal and the first coefficient. The first coefficient is expressed as D(N).

Further, in a case that the integrator receives the positive reference voltage signal ($V_{RP}$-$V_{RN}$) in the first phase (in this case, the third input capacitor $C_{I3}$ receives a positive signal $V_{RP}$ of the reference voltage and the fourth input capacitor $C_{I4}$ receives the negative signal $V_{RN}$ of the reference voltage) and receives the negative reference voltage signal ($V_{RN}$-$V_{RP}$) in the second phase (in this case, the third input capacitor $C_{I3}$ receives the negative signal $V_{RN}$ of the reference voltage and the fourth input capacitor $C_{I4}$ receives the positive signal $V_{RP}$ of the reference voltage), the first coefficient D(N) is equal to 1.

In a case that the integrator receives the negative reference voltage signal ($V_{RN}$-$V_{RP}$) in the first phase (in this case, the third input capacitor $C_{I3}$ receives the negative signal $V_{RN}$ of the reference voltage, and the fourth input capacitor $C_{I4}$ receives the positive signal $V_{RP}$ of the reference voltage) and receives the positive reference voltage signal ($V_{RP}$-$V_{RN}$) in the second phase (in this case, the third input capacitor $C_{I3}$ receives the positive signal $V_{RP}$ of the reference voltage and the fourth input capacitor $C_{I4}$ receives the negative signal $V_{RN}$ of the reference voltage), the first coefficient D(N) is equal to -1.

In a case that the integrator receives a zero reference signal in both the first phase and the second phase (in this case, the third input capacitor $C_{I3}$ receives a common mode voltage signal $V_{CM}$ and the fourth input capacitor $C_{I4}$ receives the common mode voltage signal $V_{CM}$), the first coefficient D(N) is equal to 0.

Further, whether the integrator receives a positive reference voltage signal, a negative reference voltage signal or a zero reference signal in the first phase and the second phase of a current operation cycle is determined based on an output signal of the comparison circuit at an output end of the second phase of the operation cycle immediately before the current operation cycle, so as to determine the first coefficient D(N) based on the output signal of the comparison circuit at the output end of the second phase of the operation cycle immediately before the current operation cycle.

Further, D(N) is determined based on the output signal of the comparator at the output end of the second phase of the (N-1)th cycle by: determining D(N) to be 1 in a case that the output signal of the first comparator is at a low level and the output signal of the second comparator is at a high level; determining D(N) to be 0 in a case that the output signal of the first comparator is at a low level and the output signal of the second comparator is at a low level; and determining D(N) to be -1 in a case that the output signal of the first comparator is at a high level and the output signal of the second comparator is at a low level.

Further, the first comparator compares ($V_{OP}$-$V_{ON}$) with the first threshold +$V_{TH}$ to output a first comparison signal. The second comparator compares ($V_{OP}$-$V_{ON}$) with the second threshold -$V_{TH}$ to output a second comparison signal.

In a case that ($V_{OP}$-$V_{ON}$) is greater than +$V_{TH}$, the first comparison signal is at a high level and the second comparison signal is at a low level.

In a case that ($V_{OP}$-$V_{ON}$) is greater than or equal to -$V_{TH}$ and is less than or equal to +$V_{TH}$, the first comparison signal is at a low level and the second comparison signal is at a low level.

In a case that ($V_{OP}$-$V_{ON}$) is less than -$V_{TH}$, the first comparison signal is at a low level and the second comparison signal is at a high level.

In FIGS. 7 to 10, in the first integral mode, the analog-to-digital converter generates a first result and residual charges. The residual charges are stored in the four integral capacitors. In the second integral mode shown in FIGS. 11 to 14, the analog-to-digital converter receives the residual charges and generates a second result, and performs analog-to-digital conversion based on the first result and the second result.

In the case that the integrator operates in the first integral mode, the capacitor $C_{F1}$ and the capacitor $C_{F2}$ operate in the same way and are connected in the same manner at any time. That is, the capacitor $C_{F1}$ and the capacitor $C_{F2}$ are simultaneously charged or simultaneously discharge. Therefore, the capacitor $C_{F1}$ and the capacitor $C_{F2}$ may be replaced by one integral capacitor $C_F$. Similarly, the capacitor $C_{F3}$ and the capacitor $C_{F4}$ operate in the same way and are connected in the same manner at any time. That is, the capacitor $C_{F3}$ and the capacitor $C_{F4}$ are simultaneously charged or simultaneously discharge. Therefore, the capacitor $C_{F3}$ and the capacitor $C_{F4}$ may be replaced by one integral capacitor $C_F$. In order to describe the operation process in the second integral mode, four integral capacitors are used to store the integral signal, which is not limited in the present disclosure.

Figure 11:
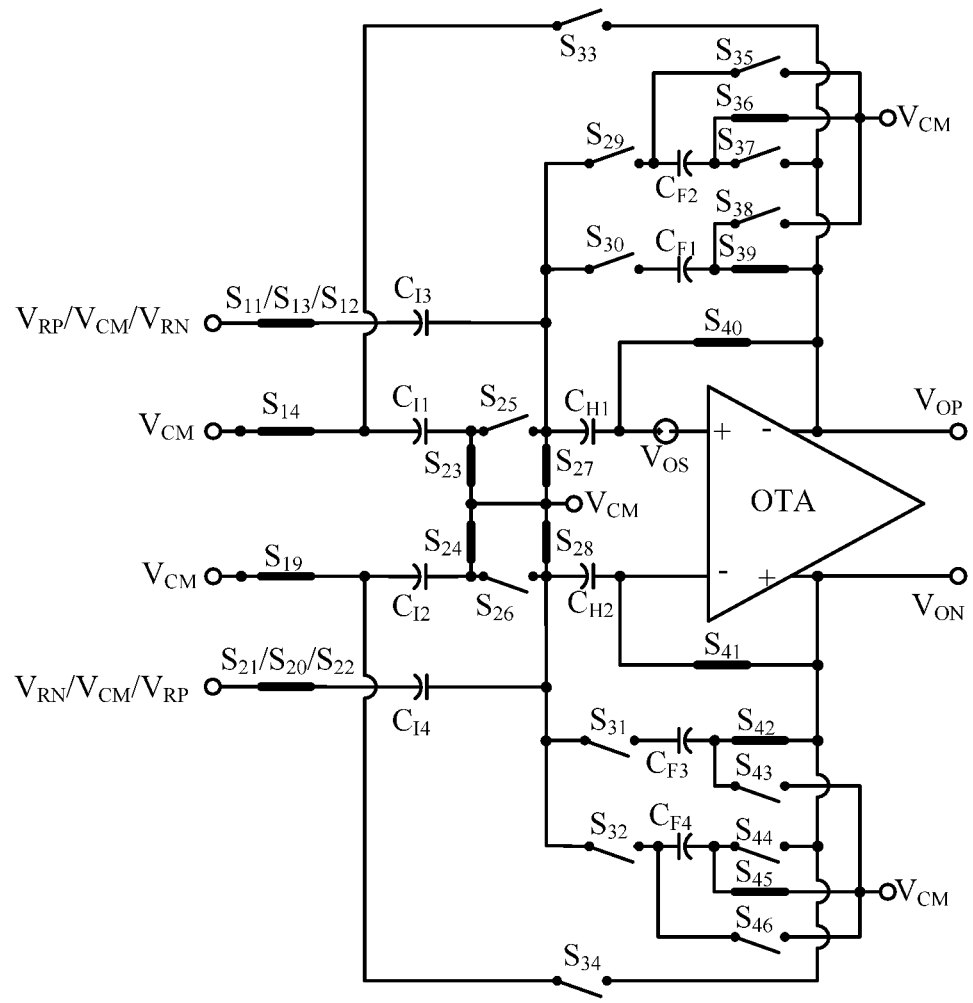
FIG. 11 is a circuit diagram of the integrator operating in a first phase of a second integral mode according to an embodiment of the present disclosure.
Figure 12:
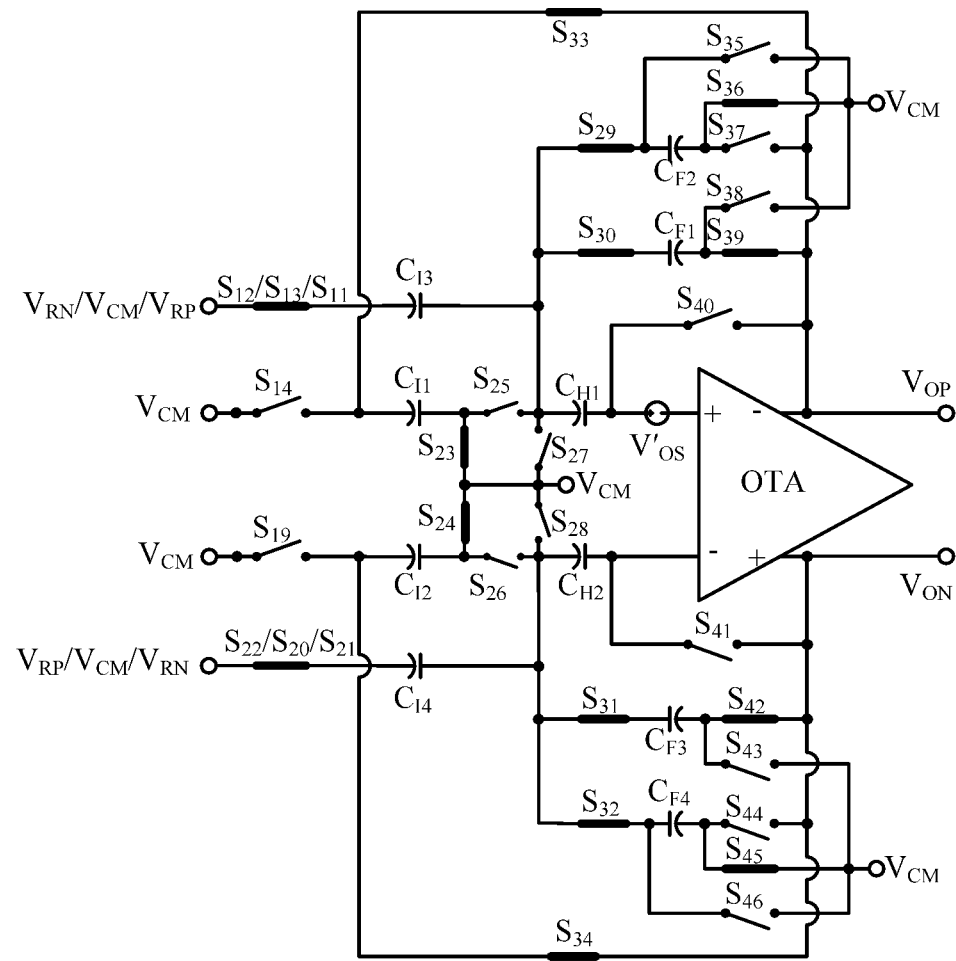
FIG. 12 is a circuit diagram of the integrator operating in a second phase of the second integral mode according to an embodiment of the present disclosure.

FIG. 11 is a circuit diagram of the integrator operating in a first phase of the second integral mode according to an embodiment of the present disclosure. FIG. 12 is a circuit diagram of the integrator operating in a second phase of the second integral mode according to an embodiment of the present disclosure. As shown in FIG. 11 and FIG. 12, the analog-to-digital converter is controlled, in the following three manners, to operate in the second integral mode.

In a first manner, the switches $S_{11}$, $S_{14}$, $S_{19}$, $S_{21}$, $S_{23}$, $S_{24}$, $S_{27}$, $S_{28}$, $S_{36}$, $S_{39}$, $S_{40}$, $S_{41}$, $S_{42}$, and $S_{45}$ are controlled to be switched on, to control the integrator to operate in the first phase of the second integral mode.

In addition, the switches $S_{12}$, $S_{22}$, $S_{23}$, $S_{24}$, $S_{29}$, $S_{30}$, $S_{31}$, $S_{32}$, $S_{33}$, $S_{34}$, $S_{36}$, $S_{39}$, $S_{42}$, and $S_{45}$ are controlled to be switched on, to control the integrator to operate in the second phase of the second integral mode.

In a second manner, the switches $S_{13}$, $S_{14}$, $S_{19}$, $S_{20}$, $S_{23}$, $S_{24}$, $S_{27}$, $S_{28}$, $S_{36}$, $S_{39}$, $S_{40}$, $S_{41}$, $S_{42}$, and $S_{45}$ are controlled to be switched on, to control the integrator to operate in the first phase of the second integral mode.

In addition, the switches $S_{13}$, $S_{20}$, $S_{23}$, $S_{24}$, $S_{29}$, $S_{30}$, $S_{31}$, $S_{32}$, $S_{33}$, $S_{34}$, $S_{36}$, $S_{39}$, $S_{42}$, and $S_{45}$ are controlled to be switched on, to control the integrator to operate in the second phase of the second integral mode.

In a third manner, the switches $S_{12}$, $S_{14}$, $S_{19}$, $S_{22}$, $S_{23}$, $S_{24}$, $S_{27}$, $S_{28}$, $S_{36}$, $S_{39}$, $S_{40}$, $S_{41}$, $S_{42}$, and $S_{45}$ are controlled to be switched on, to control the integrator to operate in the first phase of the second integral mode.

In addition, the switches $S_{11}$, $S_{21}$, $S_{23}$, $S_{24}$, $S_{29}$, $S_{30}$, $S_{31}$, $S_{32}$, $S_{33}$, $S_{34}$, $S_{36}$, $S_{39}$, $S_{42}$ and $S_{45}$ are controlled to be switched on, to control the integrator to operate in the second phase of the second integral mode.

In the embodiment, in the second integral mode, the integral capacitor is split into two capacitors. At the positive terminal, the integral capacitor is split into capacitors $C_{F1}$ and $C_{F2}$. At the negative terminal, the integral capacitor is split into capacitors $C_{F3}$ and $C_{F4}$. Capacitors $C_{F1}$ and $C_{F3}$ store the integral charges in the first phase, and are connected between the input terminal of the operational amplifier and the output terminal of the operational amplifier in the second phase to convert a charge signal into a voltage signal. At the same time, the capacitors $C_{F2}$ and $C_{F4}$ redistribute the charges. In the second phase, negative plates of capacitors $C_{F2}$ and $C_{F4}$ are connected to the common mode voltage $V_{CM}$, and voltages of the positive plates of $C_{F2}$ and $C_{F4}$ are close to $V_{CM}$, so that all charges on the capacitor $C_{F2}$ are transferred to the capacitor $C_{F1}$ and all charges on the capacitor $C_{F4}$ are transferred to the capacitor $C_{F3}$ in the second phase. Because of $C_{F1}=C_{F2}$ and $C_{F3}=C_{F4}$, the charges on $C_{F1}$ and the charges on $C_{F3}$ are doubled. Because of Q=V*C and V=Q/C, the voltage of $C_{F1}$ and the voltage of $C_{F3}$ are doubled, so that the output voltage of operational amplifier is doubled. In addition, the input capacitors $C_{I1}$ and $C_{I2}$ discharge in the first phase and sample the output signal in the second phase to prepare for amplification in the next cycle.

Further, as can be seen from FIG. 11 and FIG. 12, in the (j)th cycle of the second integral mode, in a case of $C_{IN}=C_{I1}=C_{I2}$, $C_R=C_{I3}=C_{I4}$, $C_H=C_{H1}=C_{H2}$, and $C_F=C_{F1}=C_{F2}=C_{F3}=C_{F4}$, the output signal of the operational amplifier OTA in the second phase is expressed as:

$$V'_{OP}(j) - V'_{ON}(j) = \frac{2C_F}{C_F}[V'_{OP}(j-1) - V'_{ON}(j-1)] +$$
$$D(j)\frac{2C_R}{C_F}[V_{RP} - V_{RN}] + \frac{C_{IN} + C_R}{C_F}(V'_{OS} - V_{OS})$$

In the above equation, $V'_{OP}(j)$ and $V'_{ON}(j)$ respectively represent a voltage of the first output terminal of the operational amplifier and a voltage of the second output terminal of the operational amplifier in the second phase of the (j)th cycle. D (j) is determined based on the output result of the comparator at the output end of the second phase of the (j−1)th cycle. $V_{RP}$ and $V_{RN}$ respectively present a positive signal and a negative signal of the reference voltage. $V_{OS}$ and $V'_{OS}$ respectively present an offset voltage of the analog-to-digital converter in the first phase and an offset voltage of the analog-to-digital converter in the second phase. $V'_{OP}(j-1)$ and $V_{ON}(j-1)$ respectively represent a voltage of the first output terminal of the operational amplifier and a voltage of the second output terminal of the operational amplifier in the second phase of the (j−1)th cycle. Further, in a case of $C_{IN}=C_R=C_F$ and $V_{OS}=V'_{OS}$, the above equation is transformed into:

$$V'_{OP}(j)-V'_{ON}(j)=2[V'_{OP}(j-1)-V'_{ON}(j-1)]+2*D(j)[V_{RP}-V_{RN}]$$

It can be seen from the above equation that in the second integral mode, the integrator amplifies the output voltage of the integrator in an operation cycle immediately before the current operation cycle. The integrator is configured to sample the reference voltage signal and output an integral signal. The integral signal outputted by the integrator is equal to a multiple of the sum of the first signal and the integral signal outputted by the integrator in the operation cycle immediately before the current operation cycle. The first signal is a product of the reference voltage signal and the first coefficient. The first coefficient is expressed as D(j).

Further, in a case that the integrator receives a positive reference voltage signal ($V_{RP}$−$V_{RN}$) in the first phase (in this case, the third input capacitor $C_{I3}$ receives a positive signal $V_{RP}$ of the reference voltage and the fourth input capacitor $C_{I4}$ receives the negative signal $V_{RN}$ of the reference voltage) and receives a negative reference voltage signal ($V_{RN}$−$V_{RP}$) in the second phase (in this case, the third input capacitor $C_{I3}$ receives the negative signal $V_{RN}$ of the reference voltage and the fourth input capacitor $C_{I4}$ receives the positive signal $V_{RP}$ of the reference voltage), the first coefficient D(j) is equal to 1.

In a case that the integrator receives the negative reference voltage signal ($V_{RN}$−$V_{RP}$) in the first phase (in this case, the third input capacitor $C_{I3}$ receives the negative signal $V_{RN}$ of the reference voltage and the fourth input capacitor $C_{I4}$ receives the positive signal $V_{RP}$ of the reference voltage) and receives the positive reference voltage signal ($V_{RP}$−$V_{RN}$) in the second phase (in this case, the third input capacitor $C_{I3}$ receives the positive signal $V_{RP}$ of the reference voltage and the fourth input capacitor $C_{I4}$ receives the negative signal $V_{RN}$ of the reference voltage), the first coefficient D(j) is equal to −1.

In a case that the integrator receives a zero reference signal in both the first phase and the second phase (in this case, the third input capacitor $C_{I3}$ receives a common mode voltage signal $V_{CM}$ and the fourth input capacitor $C_{I4}$ receives the common mode voltage signal $V_{CM}$), the first coefficient D(j) is equal to 0.

Further, whether the integrator receives a positive reference voltage signal, a negative reference voltage signal or a zero reference signal in the first phase and the second phase of a current operation cycle is determined based on an output signal of the comparison circuit at an output end of the second phase of the operation cycle immediately before the current operation cycle, so as to determine the first coefficient D(j) based on the output signal of the comparison circuit at the output end of the second phase of the operation cycle immediately before the current operation cycle.

D(j) is determined based on the output signal of the comparison circuit at the output end of the second phase of the (j−1)th cycle by: determining D(j) to be 1 in a case that the output signal of the first comparator is at a low level and the output signal of the second comparator is at a high level; determining D(j) to be 0 in a case that the output signal of the first comparator is at a low level and the output signal of the second comparator is at a low level; and determining D(j) to be −1 in a case that the output signal of the first comparator is at a high level and the output signal of the second comparator is at a low level.

Further, the first comparator compares ($V_{OP}$−$V_{ON}$) with the first threshold +$V_{TH}$ and outputs a first comparison signal. The second comparator compares ($V_{OP}$−$V_{ON}$) with the second threshold −$V_{TH}$ and outputs a second comparison signal.

In a case that ($V_{OP}$−$V_{ON}$) is greater than +$V_{TH}$, the first comparison signal is at a high level and the second comparison signal is at a low level.

In a case that ($V_{OP}$−$V_{ON}$) is greater than or equal to −$V_{TH}$ and is less than or equal to +$V_{TH}$, the first comparison signal is at a low level and the second comparison signal is at a low level.

In a case that ($V_{OP}$−$V_{ON}$) is less than −$V_{TH}$, the first comparison signal is at a low level and the second comparison signal is at a high level.

Figure 13:
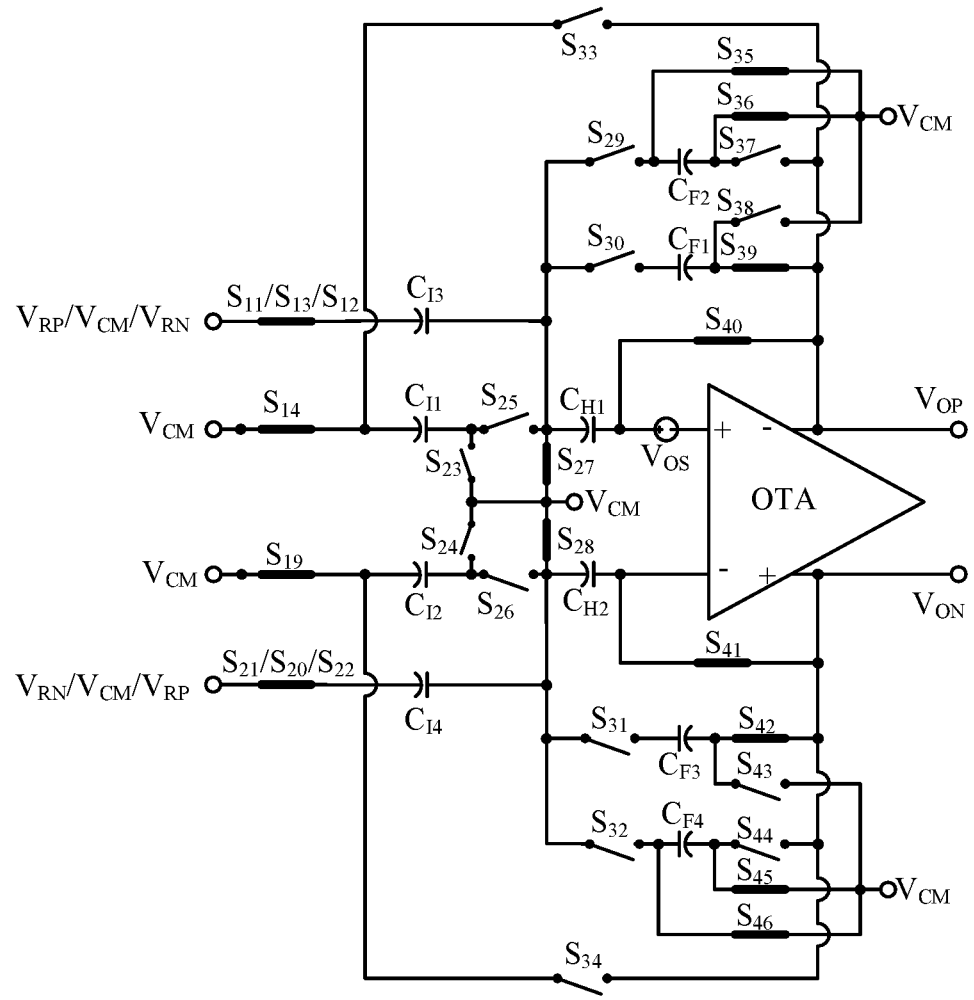
FIG. 13 is a circuit diagram of the integrator operating in the first phase of the second integral mode according to an embodiment of the present disclosure.
Figure 14:
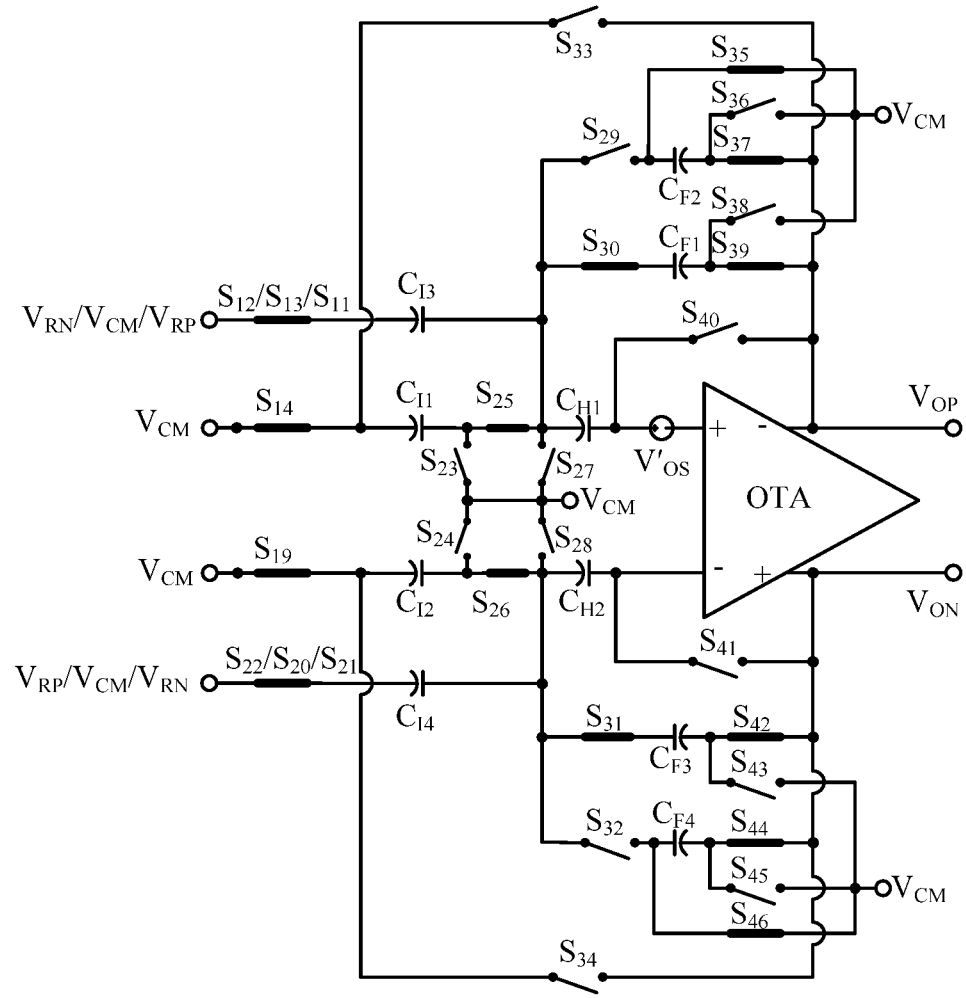
FIG. 14 is a circuit diagram of the integrator operating in the second phase of the second integral mode according to an embodiment of the present disclosure.

FIG. 13 is a circuit diagram of the integrator operating in the first phase of the second integral mode according to an embodiment of the present disclosure. FIG. 14 is a circuit diagram of the integrator operating in the second phase of the second integral mode according to the embodiment of the present disclosure. As shown in FIG. 13 and FIG. 14, the analog-to-digital converter is controlled, in the following three manners, to operate in the second integral mode.

In a first manner, the switches $S_{11}$, $S_{14}$, $S_{19}$, $S_{21}$, $S_{27}$, $S_{28}$, $S_{35}$, $S_{36}$, $S_{39}$, $S_{40}$, $S_{41}$, $S_{42}$, $S_{45}$ and $S_{46}$ are controlled to be switched on, to control the integrator to operate in the first phase of the second integral mode.

In addition, the switches $S_{12}$, $S_{14}$, $S_{19}$, $S_{22}$, $S_{25}$, $S_{26}$, $S_{30}$, $S_{31}$, $S_{35}$, $S_{37}$, $S_{39}$, $S_{42}$, $S_{44}$ and $S_{46}$ are controlled to be switched on, to control the integrator to operate in the second phase of the second integral mode.

In a second manner, the switches $S_{13}$, $S_{14}$, $S_{19}$, $S_{20}$, $S_{27}$, $S_{28}$, $S_{35}$, $S_{36}$, $S_{39}$, $S_{40}$, $S_{41}$, $S_{42}$, $S_{45}$, and $S_{46}$ are controlled to be switched on, to control the integrator to operate in the first phase of the second integral mode.

In addition, the switches $S_{13}$, $S_{14}$, $S_{19}$, $S_{20}$, $S_{25}$, $S_{26}$, $S_{30}$, $S_{31}$, $S_{35}$, $S_{37}$, $S_{39}$, $S_{42}$, $S_{44}$ and $S_{46}$ are controlled to be switched on, to control the integrator to operate in the second phase of the second integral mode.

In a third manner, the switches $S_{12}$, $S_{14}$, $S_{19}$, $S_{22}$, $S_{27}$, $S_{28}$, $S_{35}$, $S_{36}$, $S_{39}$, $S_{40}$, $S_{41}$, $S_{42}$, $S_{45}$ and $S_{46}$ are controlled to be switched on, to control the integrator to operate in the first phase of the second integral mode.

In addition, the switches $S_{11}$, $S_{14}$, $S_{19}$, $S_{21}$, $S_{25}$, $S_{26}$, $S_{30}$, $S_{31}$, $S_{35}$, $S_{37}$, $S_{39}$, $S_{42}$, $S_{44}$ and $S_{46}$ are controlled to be switched on, to control the integrator to operate in the second phase of the second integral mode.

In the embodiment, in the second integral mode, the integral capacitor $C_F$ is split into two capacitors. At the positive terminal, the integral capacitor is split into capacitors $C_{F1}$ and $C_{F2}$. At the negative terminal, the integral capacitor is split into capacitors $C_{F3}$ and $C_{F4}$. The capacitors $C_{F1}$ and $C_{F3}$ store the integral charges in the first phase, and are connected between the input terminal of the operational amplifier and the output terminal of the operational amplifier in the second phase to convert a charge signal into a voltage signal. At the same time, the capacitors $C_{I1}$ and $C_{I2}$ redistribute the charges. The capacitors $C_{I1}$ and $C_{I2}$ sample the output voltage and storage the sampled output voltage in the operation cycle immediately before the current operation cycle. In the second phase, negative plates of the capacitors $C_{I1}$ and $C_{I2}$ are connected to the common mode voltage $V_{CM}$, and voltages of the positive plates of $C_{I1}$ and $C_{I2}$ are close to $V_{CM}$, so that all charges on the capacitor $C_{I1}$ are transferred to the capacitor $C_{F1}$ and all charges on $C_{I2}$ are transferred to the capacitor $C_{F3}$ in the second phase. Because of $C_{F1}=C_{I1}$ and $C_{F3}=C_{I2}$, the charges on $C_{F1}$ and the charges on $C_{F3}$ are doubled. Because of $Q=V*C$ and $V=Q/C$, the voltage of $C_{F1}$ and the voltage of $C_{F3}$ are doubled, so that the output voltage of operational amplifier is doubled. In addition, the integral capacitors $C_{F2}$ and $C_{F4}$ discharge in the first phase and sample the output signal in the second phase to prepare for amplification in the next period.

Further, as can be seen from FIG. 13 and FIG. 14, in the (j)th cycle of the second integral mode, in a case of $C_{IN}=C_{I1}=C_{I2}$, $C_R=C_{I3}=C_{I4}$, $C_H=C_{H1}=C_{H2}$, and $C_F=C_{F1}=C_{F2}=C_{F3}=C_{F4}$, the output signal of the operational amplifier OTA in the second phase is expressed as:

$$V'_{OP}(j) - V'_{ON}(j) = \frac{C_F + C_{IN}}{C_F}[V'_{OP}(j-1) - V'_{ON}(j-1)] + D(j)\frac{2C_R}{C_F}[V_{RP} - V_{RN}] + \frac{C_{IN} + C_R}{C_F}(V'_{OS}V_{OS})$$

In the above equation, $V'_{OP}(j)$ and $V'_{ON}(j)$ respectively represent a voltage of the first output terminal of the operational amplifier and a voltage of the second output terminal of the operational amplifier in the second phase of the (j)th cycle. D(j) is determined based on the output result of the comparator at the output end of the second phase of the (j−1)th cycle. $V_{RP}$ and $V_{RN}$ respectively present a positive signal and a negative signal of the reference voltage. $V_{OS}$ and $V'_{OS}$ respectively present an offset voltage of the analog-to-digital converter in the first phase and an offset voltage of the analog-to-digital converter in the second phase. $V'_{OP}(j-1)$ and $V_{ON}(j-1)$ respectively present a voltage of the first output terminal of the operational amplifier and a voltage of the second output terminal of the operational amplifier in the second phase of the (j−1)th cycle. Further, in a case of $C_{I1}=C_{I2}=C_{I3}=C_{I4}=C_F$ and $V_{OS}=V'_{OS}$, the above equation is transformed into:

$$V'_{OP}(j)-V'_{ON}(j)=2[V'_{OP}(j-1)-V'_{ON}(j-1)]+2*D(j)[V_{RP}-V_{RN}]$$

It can be seen from the above equation that in the second integral mode, the integrator amplifies the output voltage of the integrator in the operation cycle immediately before the current operation cycle. The integrator is configured to sample the reference voltage signal and output an integral signal. The integral signal outputted by the integrator is equal to a multiple of the sum of the integral signal outputted by the integrator in the operation cycle immediately before the current operation cycle and the first signal. The first signal is a product of the reference voltage signal and the first coefficient. The first coefficient is expressed as D(j).

Further, in a case that the integrator receives a positive reference voltage signal ($V_{RP}-V_{RN}$) in the first phase (in this case, the third input capacitor $C_{I3}$ receives a positive signal $V_{RP}$ of the reference voltage and the fourth input capacitor $C_{I4}$ receives the negative signal $V_{RN}$ of the reference voltage) and receives a negative reference voltage signal ($V_{RN}-V_{RP}$) in the second phase (in this case, the third input capacitor $C_{I3}$ receives the negative signal $V_{RN}$ of the reference voltage and the fourth input capacitor $C_{I4}$ receives the positive signal $V_{RP}$ of the reference voltage), the first coefficient D(j) is equal to 1.

In a case that the integrator receives the negative reference voltage signal ($V_{RN}-V_{RP}$) in the first phase (in this case, the third input capacitor $C_{I3}$ receives the negative signal $V_{RN}$ of the reference voltage and the fourth input capacitor $C_{I4}$ receives the positive signal $V_{RP}$ of the reference voltage) and receives the positive reference voltage signal ($V_{RP}-V_{RN}$) in the second phase (in this case, the third input capacitor $C_{I3}$ receives the positive signal $V_{RP}$ of the reference voltage and the fourth input capacitor $C_{I4}$ receives the negative signal $V_{RN}$ of the reference voltage), the first coefficient D(j) is equal to −1.

In a case that the integrator receives a zero reference signal in both the first phase and the second phase (in this case, the third input capacitor $C_{I3}$ receives a common mode voltage signal $V_{CM}$ and the fourth input capacitor $C_{I4}$ receives the common mode voltage signal $V_{CM}$), the first coefficient D(j) is equal to 0.

Further, whether the integrator receives a positive reference voltage signal, a negative reference voltage signal or a zero reference signal in the first phase and the second phase of a current operation cycle is determined based on an output signal of the comparison circuit at an output end of the second phase of the operation cycle immediately before the current operation cycle, so as to determine the first coefficient D(j) based on the output signal of the comparison circuit at the output end of the second phase of the operation cycle immediately before the current operation cycle.

D(j) is determined based on the output signal of the comparison circuit at the output end of the second phase of the (j−1)th cycle by: determining D(j) to be 1 in a case that the output signal of the first comparator is at a low level and the output signal of the second comparator is at a high level; determining D(j) to be 0 in a case that the output signal of the first comparator is at a low level and the output signal of the second comparator is at a low level; and determining D(j) to be −1 in a case that the output signal of the first comparator is at a high level and the output signal of the second comparator is at a low level.

Further, the first comparator compares ($V_{OP}-V_{ON}$) with the first threshold +$V_{TH}$ to output a first comparison signal. The second comparator compares ($V_{OP}-V_{ON}$) with the second threshold −$V_{TH}$ to output a second comparison signal.

In a case that ($V_{OP}-V_{ON}$) is greater than +$V_{TH}$, the first comparison signal is at a high level and the second comparison signal is at a low level.

In a case that ($V_{OP}-V_{ON}$) is greater than or equal to −$V_{TH}$ and is less than or equal to +$V_{TH}$, the first comparison signal is at a low level and the second comparison signal is at a low level.

In a case that ($V_{OP}-V_{ON}$) is less than −$V_{TH}$, the first comparison signal is at a low level and the second comparison signal is at a high level.

In an embodiment, in a case that the integrator 1 operates in the second integral mode, the integrator 1 alternately operates in two cases of the second integral mode, and the two cases are described in the above two embodiments. That is, in the operation cycle immediately before the current operation cycle, the integrator 1 operates as shown in FIG. 11 and FIG. 12. In the current cycle, the integrator 1 operates as shown in FIG. 13 and FIG. 14. In a cycle immediately after the current cycle, the integrator 1 operates as shown in FIG. 11 and FIG. 12, and so on. As described above, in the second integral mode shown in FIG. 11 to FIG. 14, the charges are redistributed by the integral capacitors and the input capacitors alternately.

Further, it can be seen from FIG. 5 to FIG. 14 that in the first phase and the second phase of each operation mode, the first offset capacitor $C_{H1}$ and the second offset capacitor $C_{H2}$ are connected in the same manner. For ease of illustration, the offset voltage is applied to the first input terminal of the operational amplifier, which is not limited in the present disclosure.

In the first phase:

$$V_{CM}+V_{H1}=V_{IP\_OTA}+V_{OS} \quad (1)$$

$$V_{CM}+V_{H2}=V_{IN\_OTA} \quad (2)$$

In the above equations (1) and (2), $V_{CN}$ represents the common mode voltage signal. $V_{H1}$ represents the voltage across the first offset capacitor $C_{H1}$. $V_{IP\_OTA}$ represents the voltage of the first input terminal of the operational amplifier in the first phase. $V_{OS}$ represents the offset voltage of the operational amplifier in the first phase. $V_{H2}$ represents the voltage across the second offset capacitor $C_{H2}$. $V_{IN\_OTA}$ represents the voltage of the second input terminal of the operational amplifier in the first phase.

According to the virtual short feature of the operational amplifier, the following equation (3) is obtained:

$$V_{IP\_OTA}=V_{IN\_OTA} \quad (3)$$

According to the above equations (1) and (2), in the first phase, $V_{H1}-V_{H2}=V_{OS}$ (4).

Similarly, in the second phase:

$$V'_{AP}+V_{H1}=V'_{IP\_OTA}+V'_{OS} \quad (5)$$

$$V'_{AN}+V_{H2}=V'_{IN\_OTA} \quad (6)$$

In the above equations (5) and (6), $V_{H1}$ represents the voltage across the first offset capacitor $C_{H1}$. $V'_{IP\_OTA}$ represents the voltage of the first input terminal of the operational amplifier in the second phase. $V'_{OS}$ represents the offset voltage of the operational amplifier in the second phase. $V_{H2}$ represents the voltage across the second offset capacitor $C_{H2}$. $V'_{IN\_OTA}$ represents the voltage of the second input terminal of the operational amplifier in the second phase. $V'_{AP}$ represents the voltage of the first terminal of the first offset capacitor $V_{H1}$ in the second phase. $V'_{AN}$ represents the voltage of the first terminal of the second offset capacitor $V_{H2}$ in the second phase. The second terminal of the first offset capacitor $V_{H1}$ is coupled to the first input terminal of the operational amplifier. The second terminal of the second offset capacitor $V_{H2}$ is coupled to the second input terminal of the operational amplifier.

According to the virtual short feature of the operational amplifier, the following equation (7) is obtained:

$$V'_{IP\_OTA}=V'_{IN\_OTA} \quad (7)$$

According to the above equations (5) and (6), in the second phase:

$$V'_{AP}-V'_{AN}+V_{H1}-V_{H2}=V'_{OS} \quad (8)$$

The following equation is obtained by subtracting equation (4) from equation (8):

$$V'_{AP}-V'_{AN}=V'_{OS}-V_{OS}$$

Since $V'_{OS}$ is equal to $V_{OS}$, $V'_{AP}$ is equal to $V'_{AN}$. Therefore, a circuit formed by the operational amplifier OTA, the first offset capacitor $V_{H1}$, the second offset capacitor $V_{H2}$ and the offset voltage $V_{OS}$ is equivalent to an ideal operational amplifier. In the second phase, $V'_{AP}$ and $V'_{AN}$ are equivalent to the first input terminal and the second input terminal of the ideal operational amplifier.

That is, the first offset capacitor and the second offset capacitor store the offset voltage in the first phase, and the voltages of the first offset capacitor and the second offset capacitor counteract the offset voltage in the second phase to eliminate the offset voltage of the operational amplifier.

In the embodiment, the input capacitors and the integral capacitors are controlled to be connected to the operational amplifier by controlling the controllable switches to be switched on or switched off, so as to control the integrator to operate in different operation modes and control operation states of the first offset capacitor and the second offset capacitor in the first phase and the second phase of an operation cycle. Therefore, the offset voltage of the integrator can be eliminated, and the conversion efficiency and conversion accuracy of the analog-to-digital converter can be improved.

The above descriptions are merely preferred embodiments of the present disclosure and are not intended to limit the present disclosure, and those skilled in the art can make various modifications and variations to the present disclosure. Any modifications, equivalent substitutions and improvements made within the spirit and the principle of the present disclosure are within the protection scope of the present disclosure.

The invention claimed is:

1. An integrator, comprising:
   an operational amplifier, wherein the operational amplifier comprises a first input terminal, a second input terminal, a first output terminal and a second output terminal;
   a first offset capacitor and a second offset capacitor, wherein the first offset capacitor is coupled to the first input terminal, and the second offset capacitor is coupled to the second input terminal;
   a plurality of controllable switches, a plurality of input capacitors and a plurality of integral capacitors, wherein the input capacitors and the integral capacitors are connected to the operational amplifier via the controllable switches, to control an operation mode of the integrator, wherein the controllable switches are configured to control operation states of the first offset capacitor and the second offset capacitor in a first phase and a second phase of an operation cycle to eliminate an offset voltage of the operational amplifier; and wherein:

the first offset capacitor and the second offset capacitor are configured to store the offset voltage in the first phase; and the offset voltage of the operational amplifier is eliminated by counteracting the offset voltage with a voltage across the first offset capacitor and a voltage across the second offset capacitor in the second phase.

2. The integrator according to claim 1, wherein the operation mode of the integrator comprises a return-to-zero mode, a first integral mode and a second integral mode.

3. The integrator according to claim 2, wherein
the integrator is reset in a first phase of the return-to-zero mode; and
the integrator is configured to, in a second phase of the return-to-zero mode, sample an input voltage signal and output the sampled input voltage signal.

4. The integrator according to claim 2, wherein
the integrator is configured to, in the first integral mode: sample a reference voltage signal and output an integral signal in a last operation cycle; and sample an input voltage signal and a reference voltage signal and output an integral signal in an operation cycle other than the last operation cycle.

5. The integrator according to claim 2, wherein in the first integral mode,
an integral signal outputted by the integrator in a last operation cycle is equal to a sum of an integral signal outputted by the integrator in an operation cycle immediately before the last operation cycle and a first signal; and
an integral signal outputted by the integrator in an operation cycle other than the last operation cycle is equal to a sum of an integral signal outputted by the integrator in a previous operation cycle, the first signal and an input voltage signal, wherein the first signal is a product of a reference voltage signal and a first coefficient.

6. The integrator according to claim 5, wherein
in a case that the integrator is configured to receive a positive reference voltage signal in the first phase and receive a negative reference voltage signal in the second phase, the first coefficient is equal to 1;
in a case that the integrator is configured to receive a negative reference voltage signal in the first phase and receive a positive reference voltage signal in the second phase, the first coefficient is equal to −1; and
in a case that the integrator is configured to receive a zero reference signal in the first phase and the second phase, the first coefficient is equal to 0.

7. The integrator according to claim 2, wherein the integrator is configured to, in the second integral mode, amplify an output voltage of the integrator in a previous operation cycle.

8. The integrator according to claim 2, wherein the integrator is configured to, in a first phase of the second integral mode, sample a reference voltage signal and output an integral signal, wherein in a second phase of the second integral mode, an integral signal outputted by the integrator in a current operation cycle is equal to a multiple of a sum of an integral signal outputted by the integrator in an operation cycle immediately before the current operation cycle and a first signal, wherein the first signal is a product of a reference voltage signal and a first coefficient.

9. The integrator according to claim 8, wherein
in a case that the integrator is configured to receive a positive reference voltage signal in the first phase and receive a negative reference voltage signal in the second phase, the first coefficient is equal to 1;
in a case that the integrator is configured to receive a negative reference voltage signal in the first phase and receive a positive reference voltage signal in the second phase, the first coefficient is equal to −1; and
in a case that the integrator is configured to receive a zero reference signal in the first phase and the second phase, the first coefficient is equal to 0.

10. The integrator according to claim 2, wherein
the input capacitors comprise a first input capacitor and a second input capacitor, and the integral capacitors comprise a first integral capacitor, a second integral capacitor, a third integral capacitor and a fourth integral capacitor, wherein
the first input capacitor, the first integral capacitor and the second integral capacitor each are configured to be coupled to at least one of the first input terminal and the first output terminal of the operational amplifier, and the second input capacitor, the third integral capacitor and the fourth integral capacitor each are configured to be coupled to at least one of the second input terminal and the second output terminal of the operational amplifier; and
in the second integral mode, the second integral capacitor is configured to charge the first integral capacitor in a current operation cycle, and the first input capacitor is configured to charge the first integral capacitor in an operation cycle immediately after the current operation cycle, and the fourth integral capacitor is configured to charge the third integral capacitor in the current operation cycle and the second input capacitor is configured to charge the third integral capacitor in the operation cycle immediately after the current operation cycle, to amplify an output voltage of the integrator in the current operation cycle.

11. The integrator according to claim 1, wherein the input capacitors comprise a first input capacitor, a second input capacitor, a third input capacitor and a fourth input capacitor, wherein the first input capacitor and the third input capacitor each are configured to be coupled to the first input terminal of the operational amplifier, and the second input capacitor and the fourth input capacitor each are configured to be coupled to the second input terminal of the operational amplifier, and wherein
the first input capacitor and the second input capacitor are configured to receive an input voltage signal or a common mode voltage signal, and the third input capacitor and the fourth input capacitor are configured to receive a reference voltage signal or a common mode voltage signal.

12. An analog-to-digital converter, comprising:
an integrator comprising an operational amplifier, a plurality of controllable switches and a plurality of capacitors, wherein the operational amplifier comprises a first input terminal, a second input terminal, a first output terminal and a second output terminal, and the capacitors are connected to the operational amplifier via the controllable switches;
a comparison circuit configured to receive an output signal of the integrator; and a control logic circuit configured to generate a digital signal corresponding to an input voltage signal based on an output signal of the comparison circuit, and wherein:

the controllable switches are configured to be switched on or switched off to control the analog-to-digital converter to operate in one of a reset mode, a sigma-delta analog-to-digital conversion mode and a cyclic conversion mode.

13. The analog-to-digital converter according to claim 12, wherein the capacitors comprise a first offset capacitor and a second offset capacitor, wherein
the first offset capacitor is coupled to the first input terminal of the operational amplifier, and the second offset capacitor is coupled to the second input terminal of the operational amplifier;
the first offset capacitor and the second offset capacitor are configured to store an offset voltage of the operational amplifier in a first phase; and
the offset voltage of the operational amplifier is eliminated by counteracting the offset voltage with a voltage across the first offset capacitor and a voltage across the second offset capacitor in a second phase.

14. The analog-to-digital converter according to claim 12, wherein
the analog-to-digital converter is reset in a first phase of the reset mode; and
the integrator is configured to, in a second phase of the reset mode of the analog-to-digital converter, sample an input voltage signal and output the sampled input voltage signal.

15. The analog-to-digital converter according to claim 12, wherein the integrator is configured to, in the sigma-delta analog-to-digital conversion mode of the analog-to-digital converter: sample a reference voltage signal and output an integral signal in a last operation cycle; and sample an input voltage signal and a reference voltage signal and output an integral signal in an operation cycle other than the last operation cycle.

16. The analog-to-digital converter according to claim 12, wherein in the sigma-delta analog-to-digital conversion mode of the analog-to-digital converter,
an integral signal outputted by the integrator in a last operation cycle is equal to a sum of an integral signal outputted by the integrator in an operation cycle immediately before the last operation cycle and a first signal; and
an integral signal outputted by the integrator in an operation cycle other than the last operation cycle is equal to a sum of an integral signal outputted by the integrator in a previous operation cycle, the first signal and an input voltage signal, wherein the first signal is a product of a reference voltage signal and a first coefficient.

17. The analog-to-digital converter according to claim 12, wherein the integrator is configured to, in the cyclic conversion mode of the analog-to-digital converter, amplify an output voltage of the integrator in a previous operation cycle.

18. The analog-to-digital converter according to claim 12, wherein the integrator is configured to, in a first phase of the cyclic conversion mode of the analog-to-digital converter, sample a reference voltage signal and output an integral signal, wherein in a second phase of the cyclic conversion mode of the analog-to-digital converter, an integral signal outputted by the integrator in a current operation cycle is equal to a multiple of a sum of an integral signal outputted by the integrator in an operation cycle immediately before the current operation cycle and a first signal, wherein the first signal is a product of a reference voltage signal and a first coefficient.

19. The analog-to-digital converter according to claim 16, wherein
in a case that the integrator is configured to receive a positive reference voltage signal in a first phase and receive a negative reference voltage signal in a second phase, the first coefficient is equal to 1;
in a case that the integrator is configured to receive a negative reference voltage signal in a first phase and receive a positive reference voltage signal in a second phase, the first coefficient is equal to −1; and
in a case that the integrator is configured to receive a zero reference signal in a first phase and a second phase, the first coefficient is equal to 0.

20. The analog-to-digital converter according to claim 18, wherein
in a case that the integrator is configured to receive a positive reference voltage signal in a first phase and receive a negative reference voltage signal in a second phase, the first coefficient is equal to 1;
in a case that the integrator is configured to receive a negative reference voltage signal in a first phase and receive a positive reference voltage signal in a second phase, the first coefficient is equal to −1; and
in a case that the integrator is configured to receive a zero reference signal in a first phase and a second phase, the first coefficient is equal to 0.

21. The analog-to-digital converter according to claim 19, wherein it is determined whether the integrator receives a positive reference voltage signal, a negative reference voltage signal or a zero reference signal in the first phase and the second phase of the current operation cycle based on an output signal of the comparison circuit at an output end of the second phase of the operation cycle immediately before the current operation cycle.

22. The analog-to-digital converter according to claim 12, wherein
the capacitors comprise a plurality of input capacitors and a plurality of integral capacitors, wherein the input capacitors comprise a first input capacitor and a second input capacitor, the integral capacitors comprise a first integral capacitor, a second integral capacitor, a third integral capacitor and a fourth integral capacitor, and wherein
the first input capacitor, the first integral capacitor and the second integral capacitor are configured to be coupled to at least one of the first input terminal and the first output terminal of the operational amplifier, and the second input capacitor, the third integral capacitor and the fourth integral capacitor are configured to be coupled to at least one of the second input terminal and the second output terminal of the operational amplifier; and
in the cyclic conversion mode of the analog-to-digital converter, the second integral capacitor is configured to charge the first integral capacitor in a current operation cycle, and the first input capacitor is configured to charge the first integral capacitor in an operation cycle immediately after the current operation cycle, and the fourth integral capacitor is configured to charge the third integral capacitor in the current operation cycle and the second input capacitor is configured to charge the third integral capacitor in the operation cycle immediately after the current operation cycle, to amplify an output voltage of the integrator in the current operation cycle.

23. The analog-to-digital converter according to claim 22, wherein in the cyclic conversion mode of the analog-to-digital converter,
- in the first phase, each of the first integral capacitor, the second integral capacitor, the third integral capacitor and the fourth integral capacitor is configured to store charges that are stored in the capacitor in an operation cycle immediately before the current operation cycle, and the first input capacitor and the second input capacitor each are configured to discharge; and
- in the second phase, the first integral capacitor is connected between the first input terminal and the first output terminal of the operational amplifier, the third integral capacitor is connected between the second input terminal and the second output terminal of the operational amplifier, the second integral capacitor is configured to charge the first integral capacitor, and the fourth integral capacitor is configured to charge the third integral capacitor, to amplify an output voltage of the operational amplifier, wherein the first input capacitor and the second input capacitor are configured to sample the output voltage of the integrator.

24. The analog-to-digital converter according to claim 22, wherein in the cyclic conversion mode of the analog-to-digital converter,
- in the first phase, each of the first input capacitor, the second input capacitor, the first integral capacitor and the third integral capacitor is configured to store charges that are stored in the capacitor in the operation cycle immediately before the current operation cycle, and the second integral capacitor and the fourth integral capacitor each are configured to discharge; and
- in the second phase, the first integral capacitor is connected between the first input terminal and the first output terminal of the operational amplifier, the third integral capacitor is connected between the second input terminal and the second output terminal of the operational amplifier, the first input capacitor is configured to charge the first integral capacitor and the second input capacitor is configured to charge the third integral capacitor to amplify an output voltage of the operational amplifier, wherein the second integral capacitor and the fourth integral capacitor are configured to sample the output voltage of the integrator.

25. The analog-to-digital converter according to claim 12, wherein the analog-to-digital converter is configured to sequentially operate in the reset mode, the sigma-delta analog-to-digital conversion mode and the cyclic conversion mode, to perform analog-to-digital conversion.

26. The analog-to-digital converter according to claim 12, wherein the comparison circuit is configured to compare the output signal of the integrator with a first threshold to obtain a first comparison signal and compare the output signal of the integrator with a second threshold to obtain a second comparison signal, wherein the first threshold is greater than the second threshold.

27. The analog-to-digital converter according to claim 26, wherein
- in the sigma-delta analog-to-digital conversion mode, the first comparison signal is a first high-bit comparison signal, and the second comparison signal is a second high-bit comparison signal; and
- in the cyclic conversion mode, the first comparison signal is a first low-bit comparison signal, and the second comparison signal is a second low-bit comparison signal.

28. The analog-to-digital converter according to claim 27, wherein the control logic circuit is configured to:
- acquire a first digital signal based on the first high-bit comparison signal and the first low-bit comparison signal;
- acquire a second digital signal based on the second high-bit comparison signal and the second low-bit comparison signal; and
- output the digital signal corresponding to the input voltage based on the first digital signal and the second digital signal.

* * * * *